(12) United States Patent
Lu et al.

(10) Patent No.: US 9,716,101 B2
(45) Date of Patent: Jul. 25, 2017

(54) FORMING 3D MEMORY CELLS AFTER WORD LINE REPLACEMENT

(71) Applicant: SanDisk Technologies Inc., Plano, TX (US)

(72) Inventors: Zhenyu Lu, Milpitas, CA (US); Hiro Kinoshita, Milpitas, CA (US); Daxin Mao, Milpitas, CA (US); Johann Alsmeier, San Jose, CA (US); Wenguang Shi, Milpitas, CA (US); Yingda Dong, San Jose, CA (US); Henry Chien, Milpitas, CA (US); Kensuke Yamaguchi, Milpitas, CA (US); Xiaolong Hu, Yokkaichi (JP)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 14/928,385

(22) Filed: Oct. 30, 2015

(65) Prior Publication Data
US 2016/0343718 A1    Nov. 24, 2016

Related U.S. Application Data

(60) Provisional application No. 62/164,415, filed on May 20, 2015.

(51) Int. Cl.
*H01L 27/115* (2017.01)
*H01L 27/1157* (2017.01)
(Continued)

(52) U.S. Cl.
CPC .... *H01L 27/1157* (2013.01); *H01L 27/11575* (2013.01); *H01L 27/11582* (2013.01)

(58) Field of Classification Search
CPC ........... H01L 27/1157; H01L 21/76805; H01L 21/76895; H01L 23/53257;
(Continued)

(56) References Cited

U.S. PATENT DOCUMENTS 8,330,208 B2    12/2012 Alsmeier et al.
8,709,894 B2     4/2014 Lee et al.
(Continued)

*Primary Examiner* — Peter Bradford
(74) *Attorney, Agent, or Firm* — Vierra Magen Marcus LLP

(57) ABSTRACT

Techniques for forming 3D memory arrays are disclosed. Memory openings are filled with a sacrificial material, such as silicon or nitride. Afterwards, a replacement technique is used to remove nitride from an ONON stack and replace it with a conductive material such as tungsten. Afterwards, memory cell films are formed in the memory openings. The conductive material serves as control gates of the memory cells. The control gate will not suffer from corner rounding. ONON shrinkage is avoided, which will prevent control gate shrinkage. Block oxide between the charge storage region and control gate may be deposited after control gate replacement, so the uniformity is good. Block oxide may be deposited after control gate replacement, so TiN adjacent to control gates can be thicker to prevent fluorine attacking the insulator between adjacent control gates. Therefore, control gate to control gate shorting is prevented.

11 Claims, 45 Drawing Sheets

(51) Int. Cl.
*H01L 27/11582* (2017.01)
*H01L 27/11575* (2017.01)

(58) Field of Classification Search
CPC ....... H01L 27/11582; H01L 2221/1042; H01L 2221/1063
See application file for complete search history.

(56) References Cited

U.S. PATENT DOCUMENTS

| | | |
|---|---|---|
| 2009/0159966 A1* | 6/2009 | Huang .............. H01L 21/76229 257/334 |
| 2010/0078701 A1 | 4/2010 | Shim et al. |
| 2010/0120214 A1 | 5/2010 | Park et al. |
| 2010/0155818 A1 | 6/2010 | Cho et al. |
| 2014/0167131 A1 | 6/2014 | Lu et al. |
| 2015/0076585 A1 | 3/2015 | Pachamuthu et al. |
| 2015/0236038 A1* | 8/2015 | Pachamuthu ..... H01L 27/11582 257/326 |
| 2016/0013200 A1* | 1/2016 | Yamashita ........ H01L 27/11519 257/316 |
| 2016/0056169 A1* | 2/2016 | Lee ................... H01L 27/11582 438/269 |
| 2016/0148946 A1* | 5/2016 | Hironaga ......... H01L 27/11556 257/324 |
| 2016/0211272 A1* | 7/2016 | Koka ................ H01L 27/11582 |

* cited by examiner

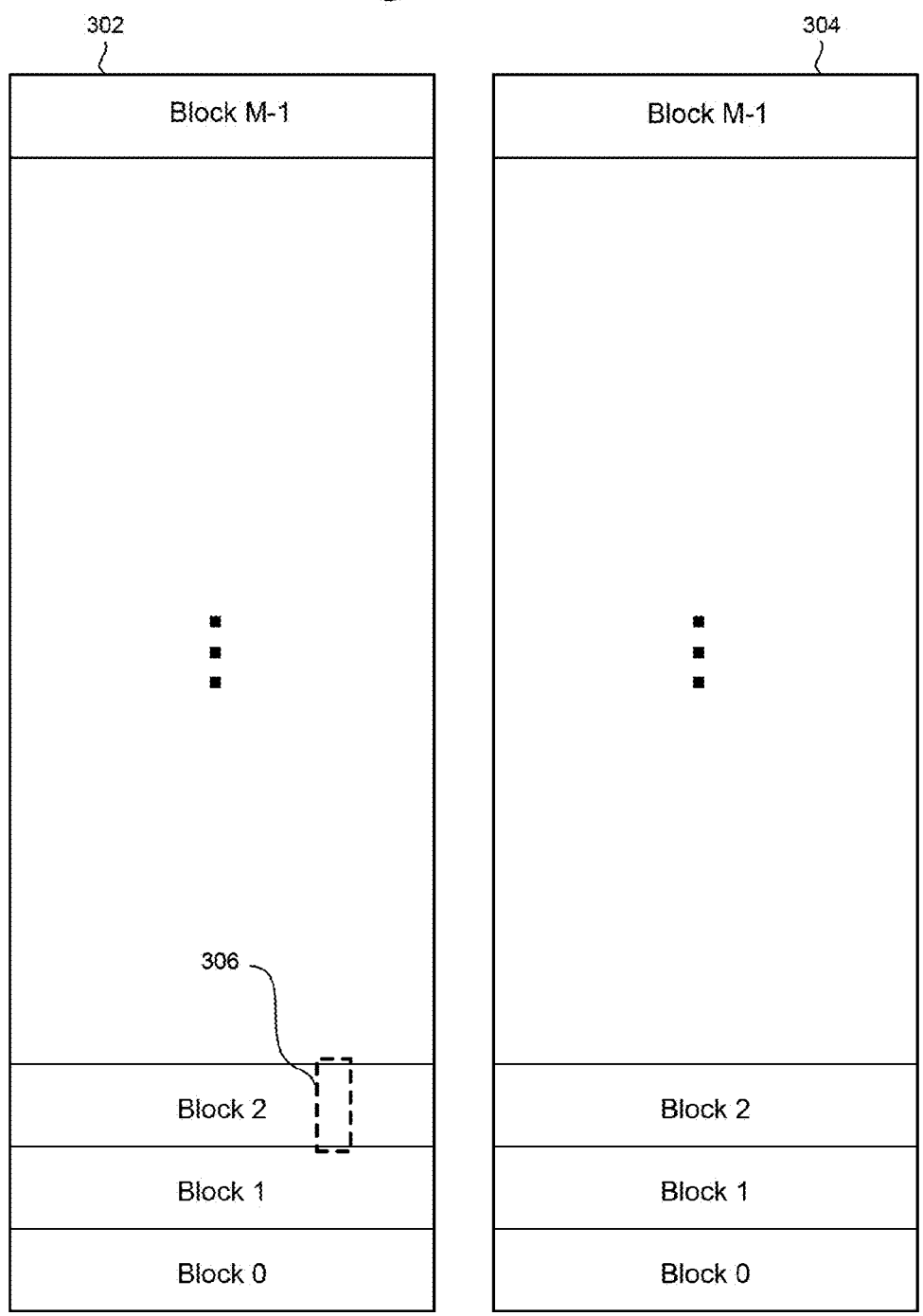

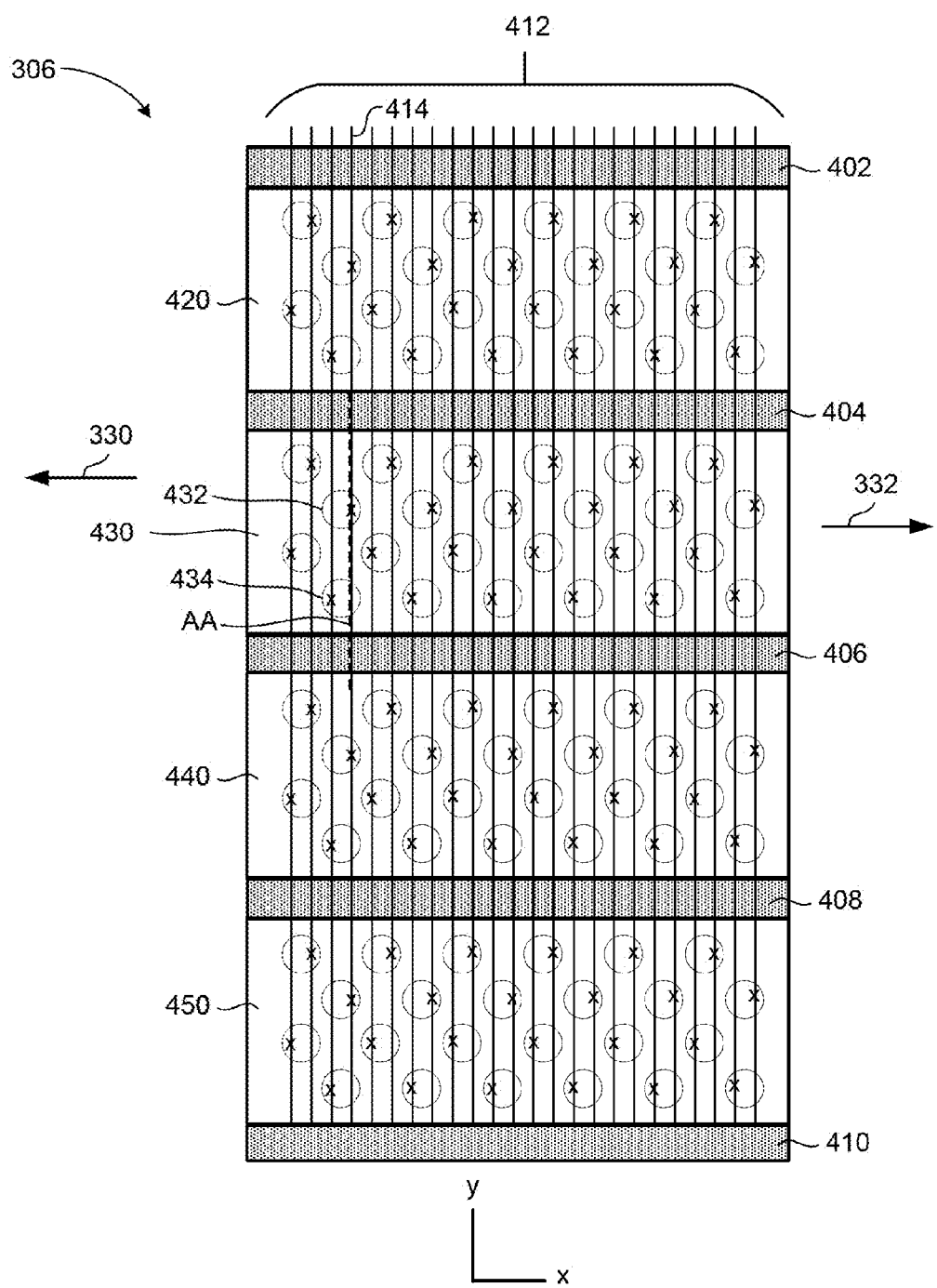

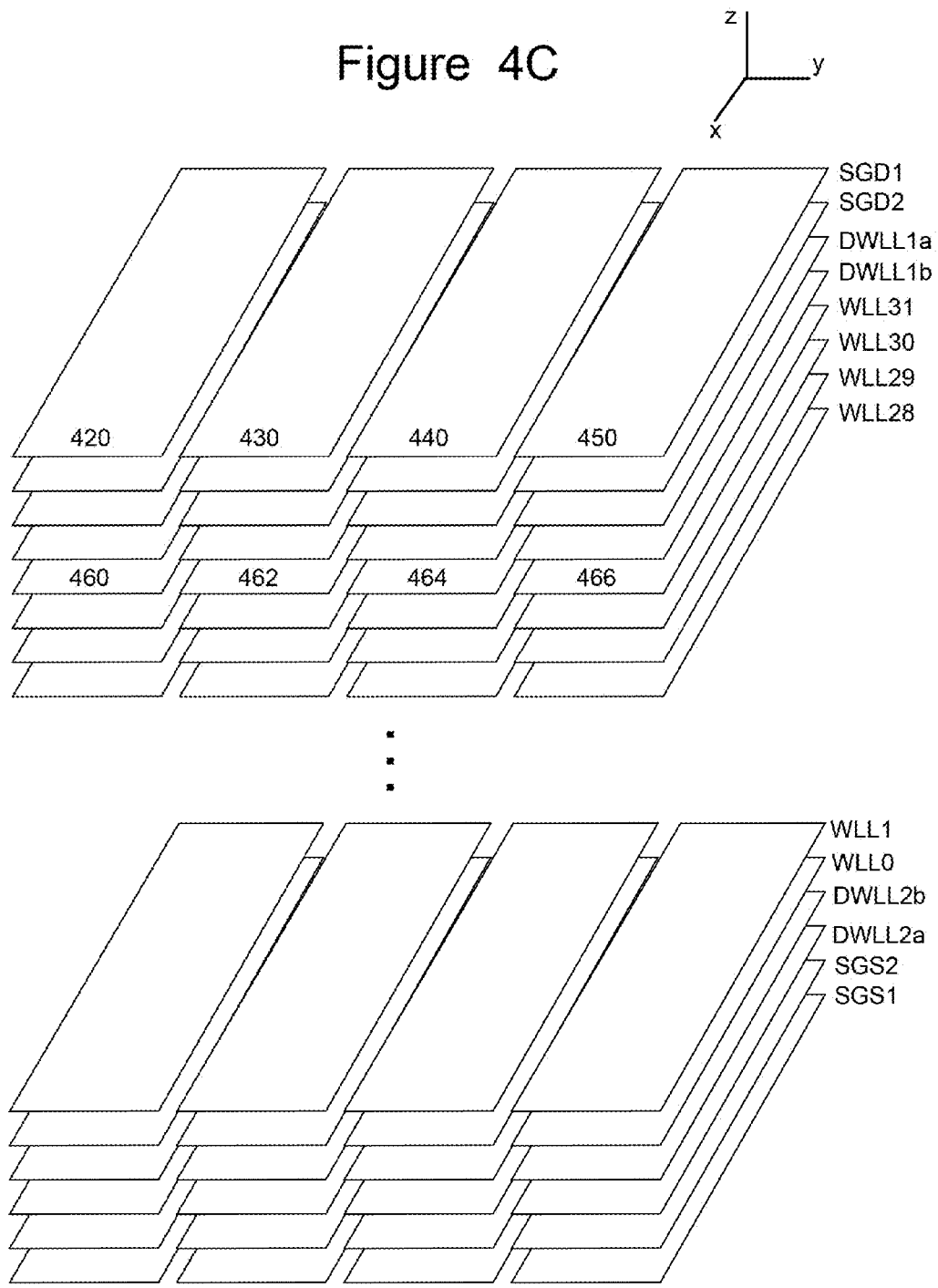

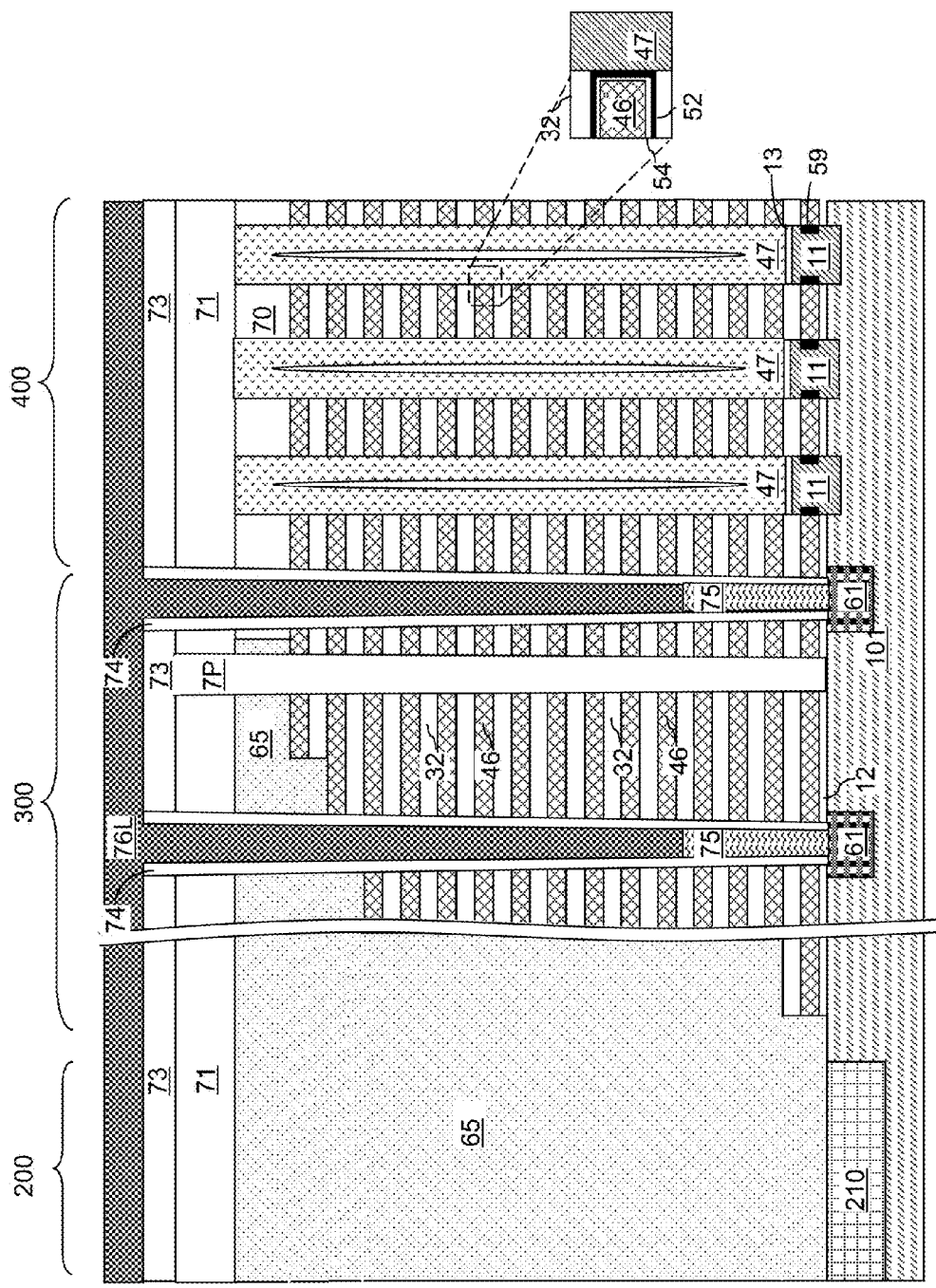

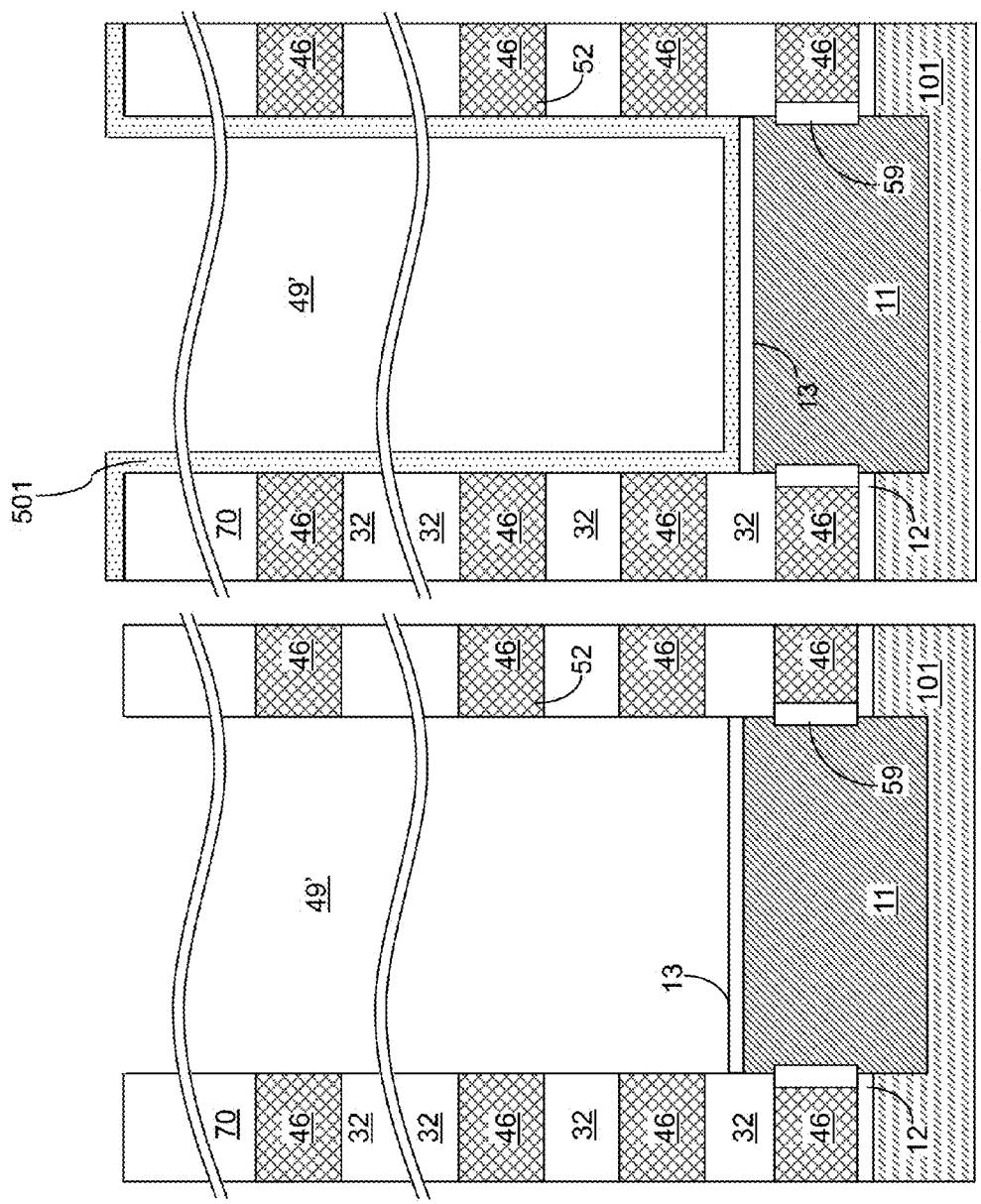

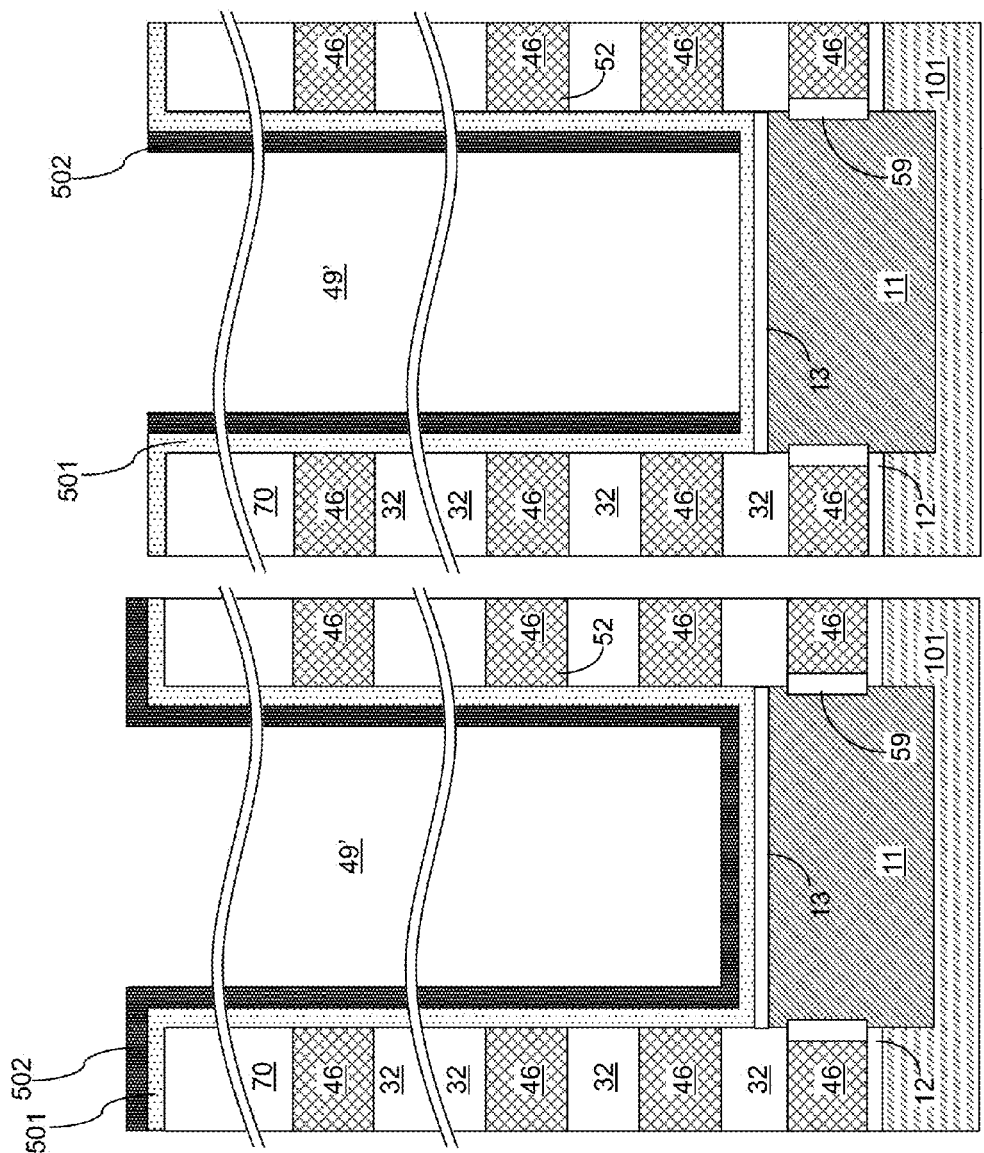

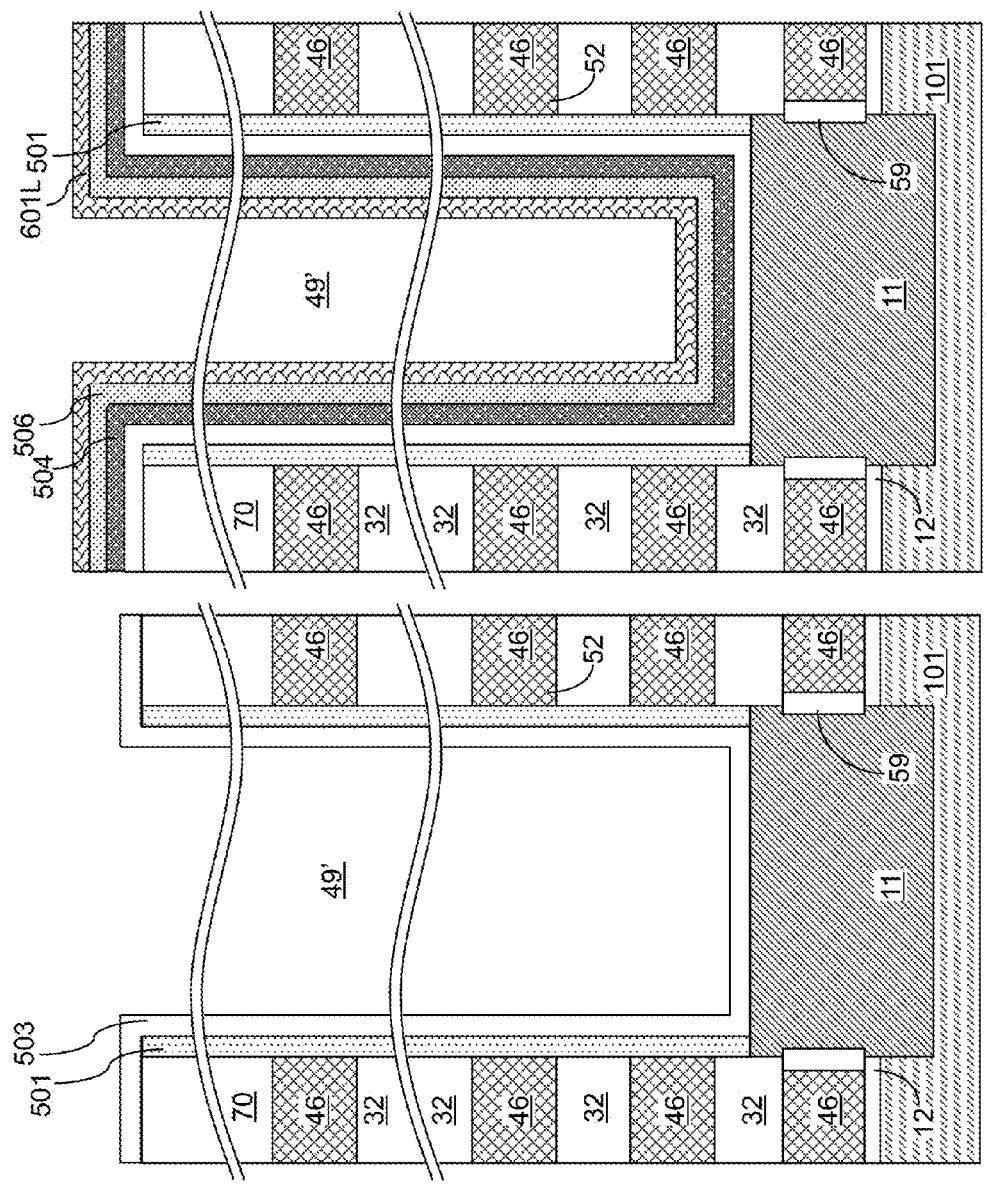

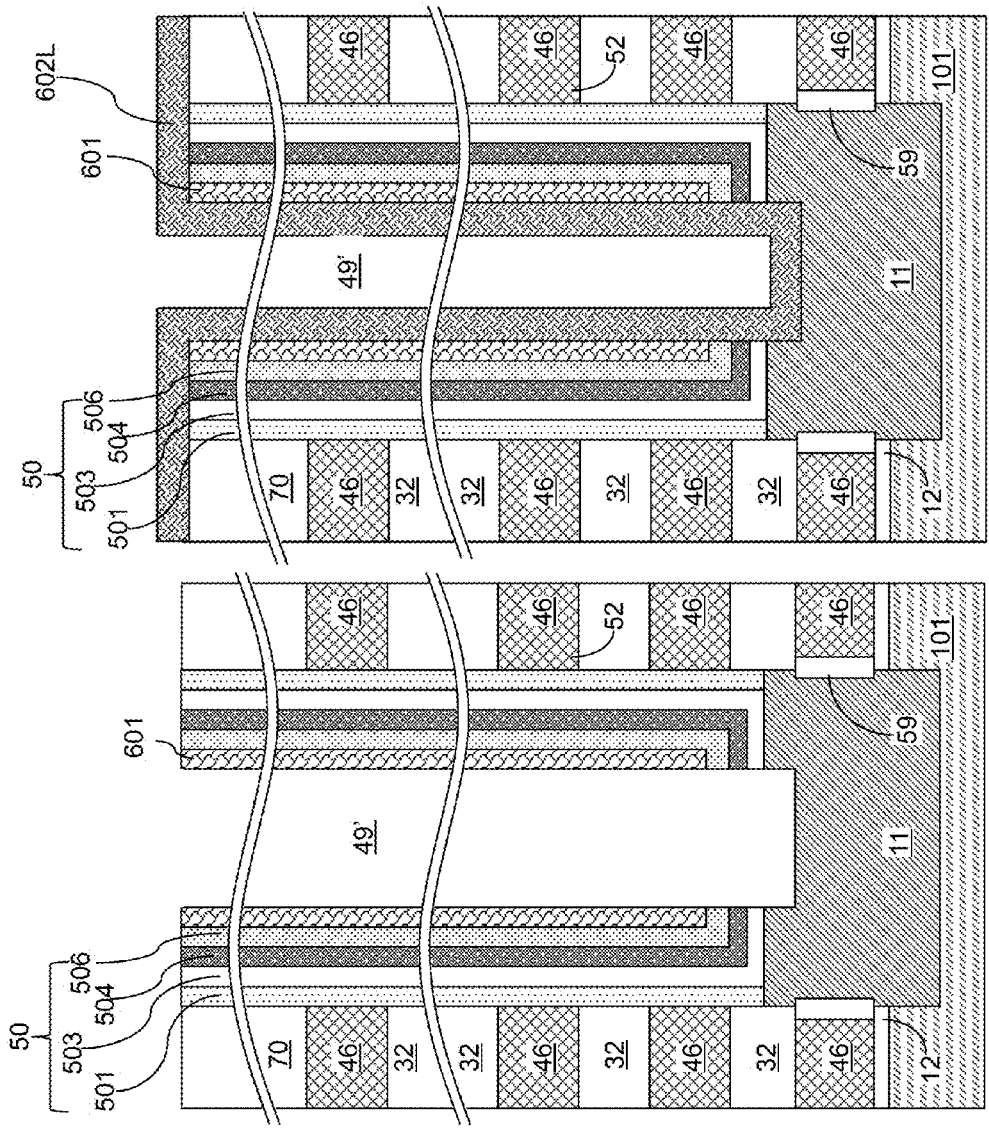

FORMING 3D MEMORY CELLS AFTER WORD LINE REPLACEMENT

CLAIM OF PRIORITY

The present application claims priority from U.S. Provisional Patent Application No. 62/164,415 entitled "MEMORY HOLE LAST BOXIM," filed May 20, 2015 and incorporated herein by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

BRIEF DESCRIPTION OF THE DRAWINGS

Like-numbered elements refer to common components in the different figures.

FIG. 3 is a block diagram of a memory structure having two planes.

FIG. 4A depicts a top view of a portion of a block of memory cells.

FIG. 4C depicts a view of the select gate layers and word line layers.

DETAILED DESCRIPTION

The present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

Some conventional process flow forms memory cells in memory holes (MH) (also referred to herein as "memory openings") first followed by replacement of sacrificial material layers with electrically conductive layers. For example, alternating horizontal layers of silicon oxide and silicon nitride (ONON) are formed. Afterwards, memory holes are drilled vertically into the ONON layers. This is followed by forming memory cell films in the memory holes. Afterwards, the silicon nitride in the ONON is removed and replaced by material, such as tungsten, for memory cell control gates.

However, the foregoing process flow has difficulties related with thermal processes of block oxide/tunnel oxide, such as control gate corner rounding, ONON shrinkage, and tungsten deficit when tungsten is employed as the electrically conductive layers. Control gate corner rounding refers the control gate becoming rounded in the vertical direction. Control gate corner rounding may lead to short channel effects and slow program speed. These problems will be discussed in more detail after first providing some example architectures.

In one embodiment, memory holes are filled with a sacrificial material, such as, but not limited to silicon or nitride. Afterwards, a replacement technique is used to remove nitride from the ONON stack and replace the nitride with conductive material such as tungsten. Afterwards, memory cell films are formed in the memory holes. The conductive material serves as control gates of the memory cells. The control gate will not suffer from corner rounding. ONON shrinkage is avoided, which will prevent control gate shrinkage. Block oxide between the charge storage region and control gate may be deposited after control gate replacement, so the uniformity is good. Since block oxide may be deposited after control gate replacement, TiN adjacent to the control gates can be thicker to prevent fluorine attacking the insulator between adjacent control gates. Therefore, control gate-to-control gate shorting is prevented. Embodiments resolve the aforementioned problems, as well as other problems.

The following discussion provides details of one example of a suitable structure for a memory devices that can be fabricated using the new process flows.

Figure 1:
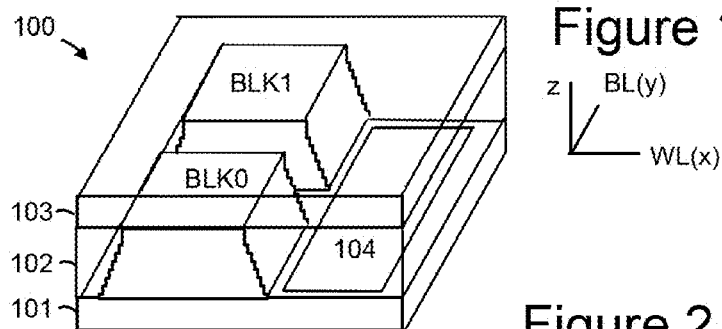
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
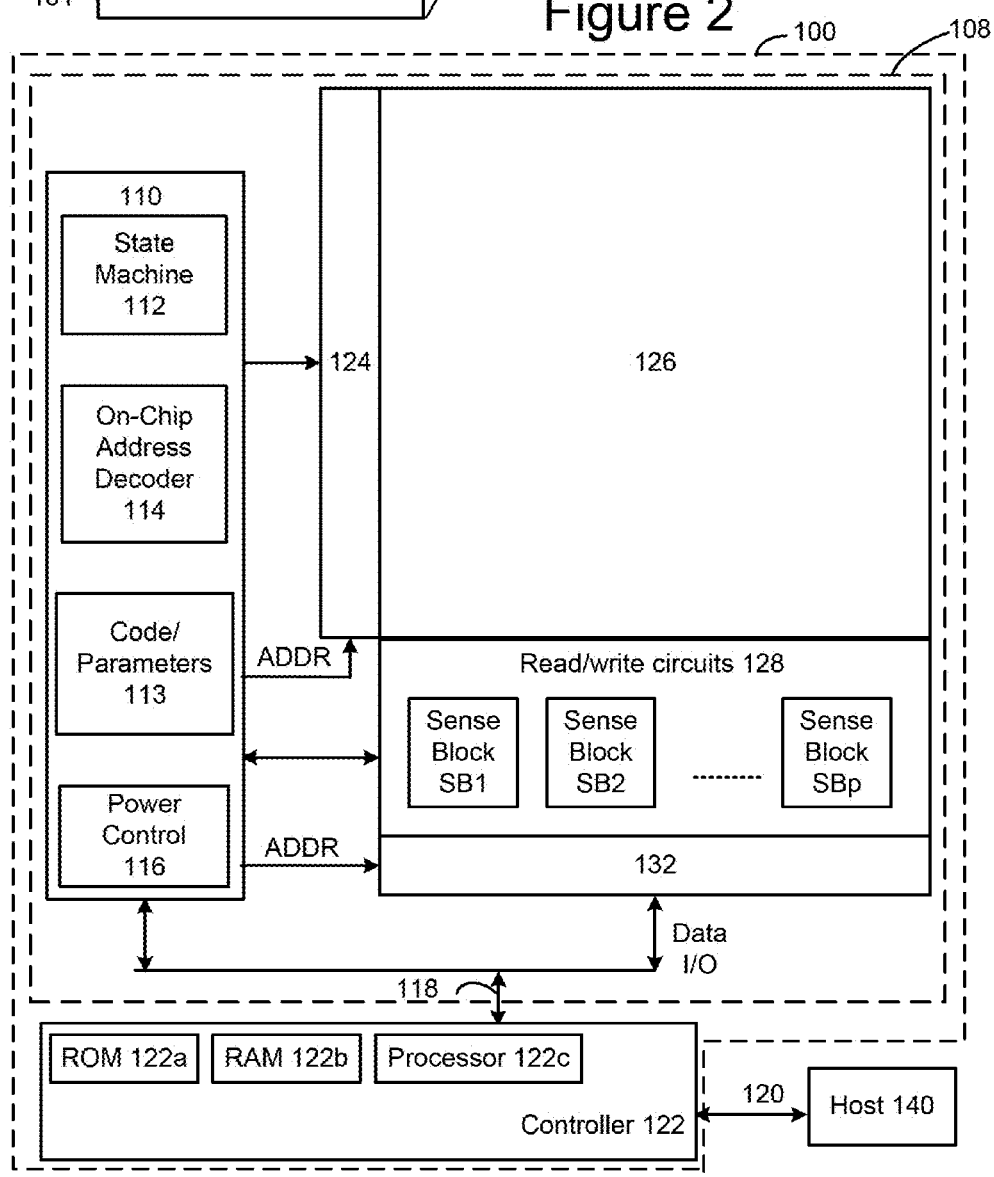
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. Memory device 100 includes one or more memory die 108. Each memory die 108 includes a three dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

FIG. 3 is a block diagram explaining one example organization of memory structure 126, which is divided into two planes 302 and 304. Each plane is then divided into M blocks. In one example, each plane has about 2000 blocks. However, different numbers of blocks and planes can also be used.

FIG. 4A is a block diagram depicting a top view of a portion of one block from memory structure 126. The portion of the block depicted in FIG. 4A corresponds to portion 306 in block 2 of FIG. 3. As can be seen from FIG. 4A, the block depicted in FIG. 4A extends in the direction of arrow 330 and in the direction of arrow 332. In one embodiment, the memory array will have 48 layers. Other embodiments have less than or more than 48 layers. However, FIG. 4A only shows the top layer.

FIG. 4A depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4A extends in the direction of arrow 330 and in the direction of arrow 332, the block includes more vertical columns than depicted in FIG. 4A.

FIG. 4A also depicts a set of bit lines 412. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4A includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4A is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4A shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4A also shows the vertical columns being staggered. In other embodiments, different patterns of staggering can be used. In some embodiments, the vertical columns are not staggered.

Figure 4B:
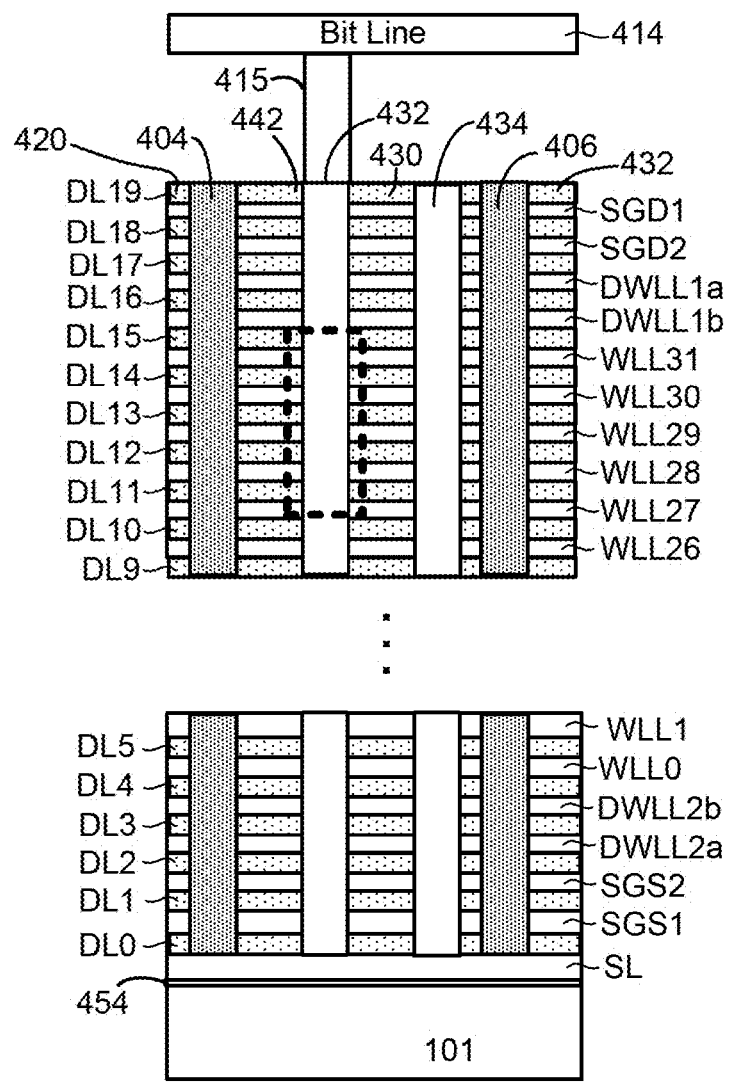
FIG. 4B depicts a cross sectional view of a portion of a block of memory cells.

FIG. 4B depicts a portion of an embodiment of three dimensional memory structure 126 showing a cross-sectional view along line AA of FIG. 4A. This cross sectional view cuts through vertical columns 432 and 434 and region 430 (see FIG. 4A). The structure of FIG. 4B includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Oher embodiments can implement more or fewer than two drain side select layers, more or fewer than two source side select layers, more or fewer than four dummy word line layers, and more or fewer than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4A, FIG. 4B show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4C depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4B. As mentioned above with respect to FIG. 4A, local interconnects 402, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL-31), the regions are referred to as word line fingers; for example, word line layer WLL31 is divided into word line fingers 460, 462, 464 and 466.

Figure 4D:
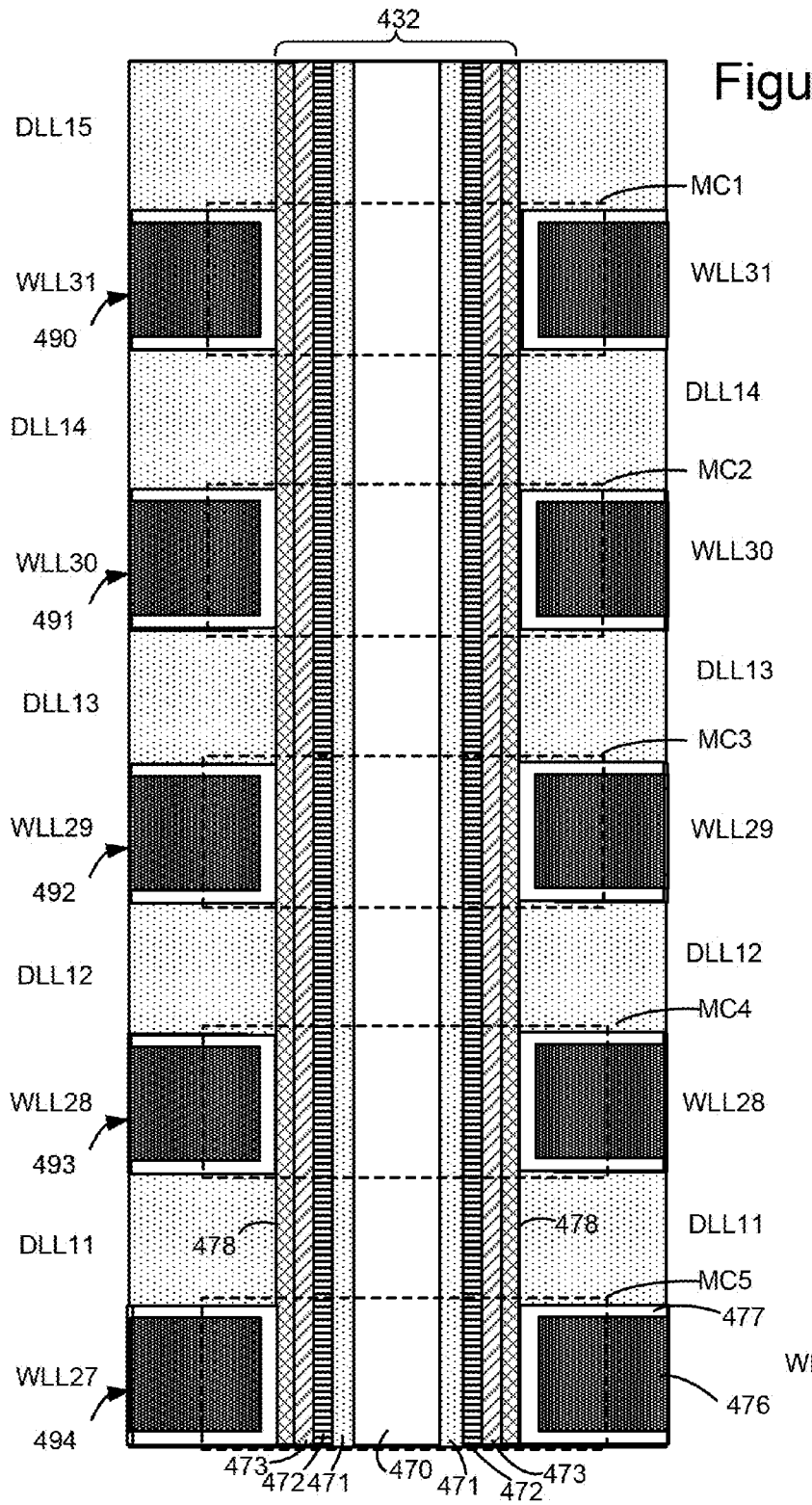
FIG. 4D is a cross sectional view of a vertical column of memory cells.

FIG. 4D depicts a cross sectional view of region 442 of FIG. 4B that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density. Surrounding charge trapping layer 473 a blocking oxide ($SiO_2$) layer 478.

FIG. 4D depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477. The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

In other embodiments, the aluminum oxide layer 477 is within the vertical column 432 between the blocking oxide layer 478 and the word line region 476. In other embodiments, both the blocking oxide layer 478 and the aluminum oxide layer 477 are outside of the vertical column 432. In this example, the same order of charge trapping layer 473, blocking oxide layer 478, and aluminum oxide layer 477 may be used. There may be a titanium nitride layer between the aluminum oxide layer 477 and the word line region 476. However, this is not depicted in FIG. 4D.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel.

Figure 5A:
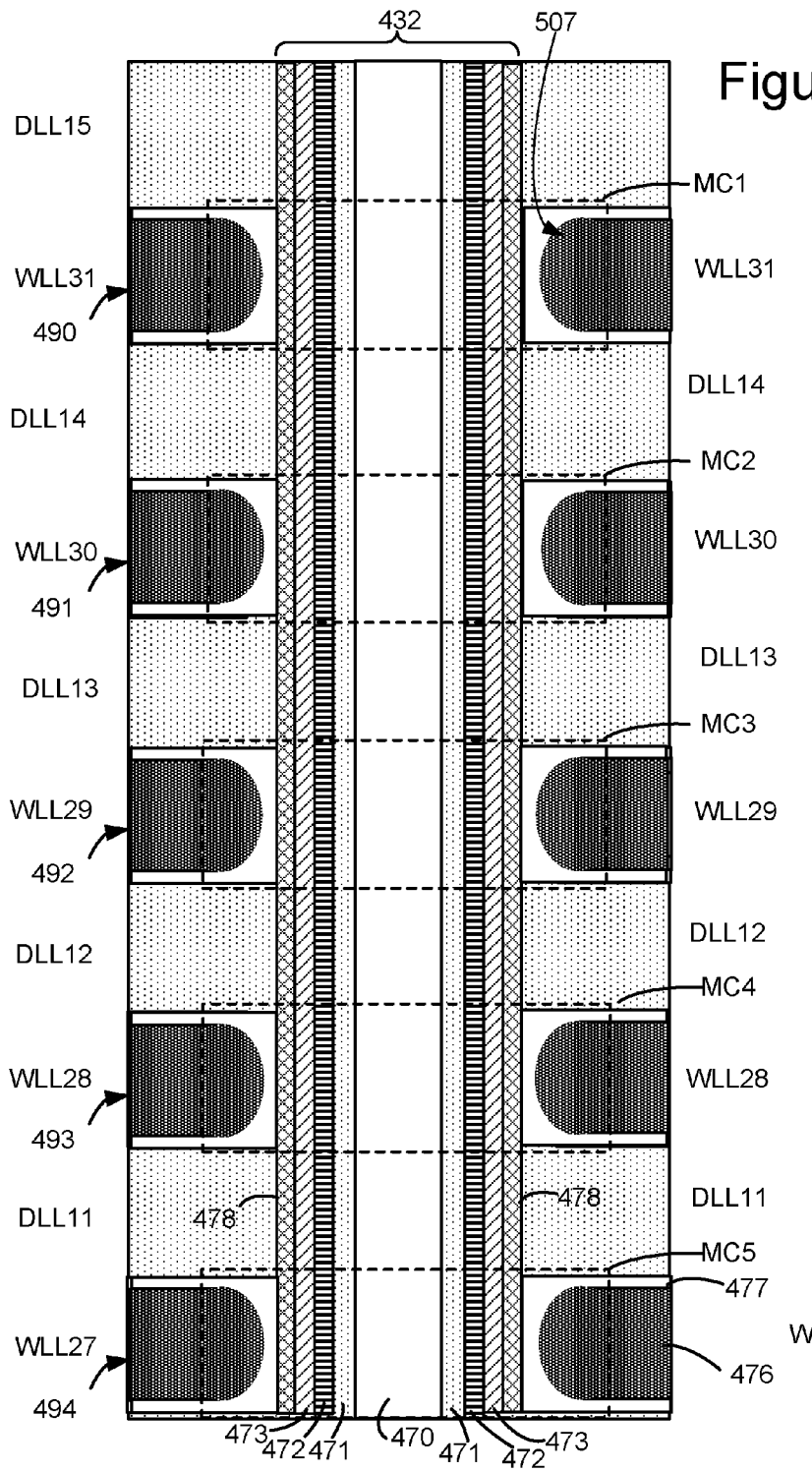
FIG. 5A is a diagram to show potential corner rounding of the control gate.

FIG. 5A is a diagram to show potential corner rounding of the control gate. The structure of FIG. 5A is similar to the one of FIG. 4D. However, there is corner rounding of the control gates. Reference numeral 507 points to the corner rounding on control gate WLL31. The other control gates WLL27-WLL30 also show some corner rounding. This corner rounding 507 corresponds to an increase in the thickness of portions of the aluminum oxide layer 477. Therefore, the thickness of aluminum oxide layer 477 is not uniform. A consequence of the foregoing is that the gate length of the memory cells is shortened. This can lead to short channel effects. Short channel effects can slow programming speeds.

Embodiments disclosed herein include fabrication techniques that reduce or eliminate corner rounding of control gates in a 3D memory structure. Embodiments disclosed herein include fabrication techniques that result in uniform aluminum oxide layers. Embodiments disclosed herein include fabrication techniques that reduce or eliminate short channel effects. Therefore, programming speed may be increased. In some embodiments, corner rounding is prevented because there is no ISSG during fabrication to oxidize nitride.

Figure 5B:
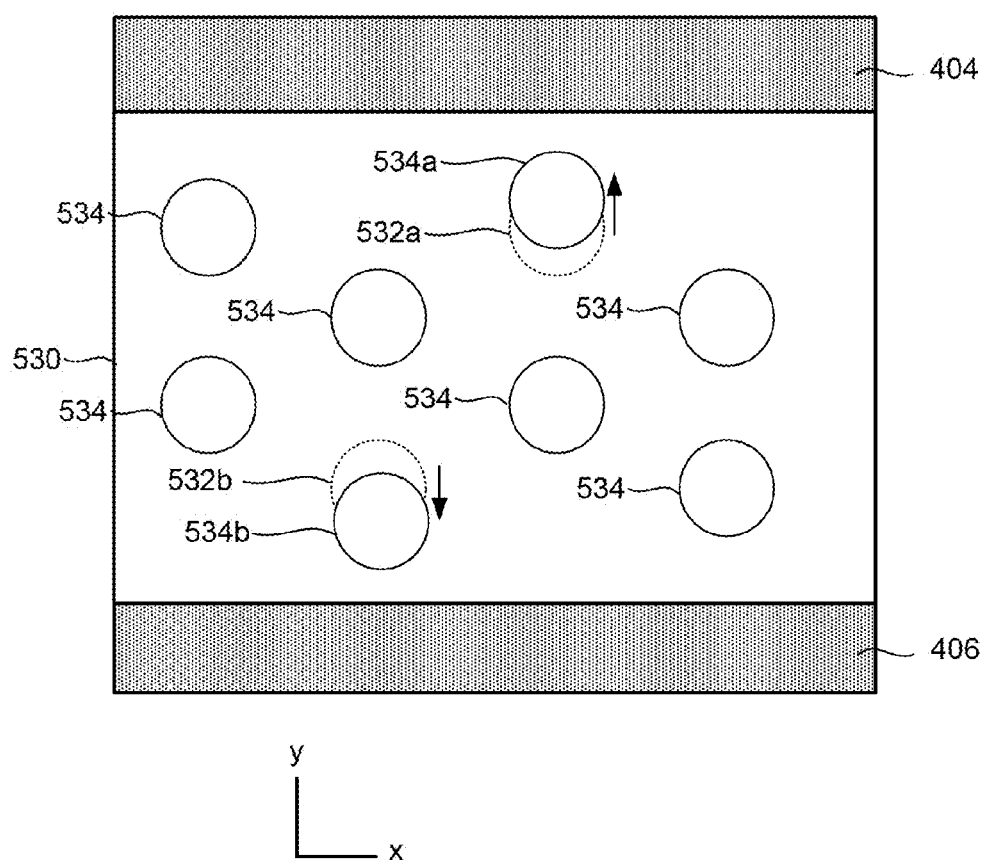
FIG. 5B is a diagram to illustrate memory hole tilt due to ONON shrinkage.

Another problem that may occur is ONON shrinkage. Recall that ONON refers to the alternating horizontal layers of silicon oxide and silicon nitride. Also recall that memory holes may be drilled vertically in the ONON. If the ONON shrinks, this may cause the memory the memory holes to tilt. This can reduce the distance between memory holes and ST. FIG. 5B is a diagram to illustrate this effect. This diagram is similar to the diagram of 4A, but only shows the region between local interconnects 404 and 406. The cross sectional view cuts through vertical columns 534 and word line layer 530. Dashed regions 532a and 532b depict an ideal alignment for vertical columns 534a and 534b, respectively. Solid regions 534a and 534b depict actual locations for those vertical columns. Note that vertical column 534a has shifted toward local interconnect 404, and that vertical column 534b has shifted toward local interconnect 406. This reduces the size of the word line layer 530 between the vertical column 534a, 534b and the local interconnects 404, 406, which is undesirable. This effect may also be referred to as control gate shrinkage.

Embodiments disclosed herein provide techniques for fabricating 3D memory in which ONON shrinkage is reduced or prevented. Embodiments disclosed herein provide techniques for fabricating 3D memory in which titling of vertical columns (in which memory cells are formed) is reduced or prevented. Embodiments disclosed herein provide techniques for fabricating 3D memory in which the word line shrinkage just discussed is reduced or prevented.

In case the electrically conductive layers (e.g., WLL) are formed employing a tungsten fill process, the tungsten fill process may employ a fluorine-containing gas which could attack silicon oxide and cause electrical shorts between word lines. Referring again to FIG. 5A, sometimes the material between the tungsten WLL and the dielectric DLL is too thin. For example, TiN (not explicitly depicted in FIG. 5A) and/or the aluminum oxide 477 may be too thin. Thus, the fluorine-containing gas may pass into the dielectric layers DLL11-DLL15. If dielectric layers DLL11-DLL15 are formed from silicon oxide, then shorts may form between word lines (WLL).

Embodiments disclosed herein provide techniques for fabricating 3D memory which reduce or prevent electrical shorts between word lines due to, for example, fluorine-containing gas that attacks silicon oxide. Embodiments disclosed herein provide for a techniques for fabricating 3D memory in which an aluminum oxide blocking layer is formed after conductive word line layers have been formed. This allows for thicker TiN layers between the conductive word line layers and insulating layers. A thicker titanium nitride layer may reduce or prevent fluorine-containing gas attacking silicon oxide between the word lines.

Figure 6:
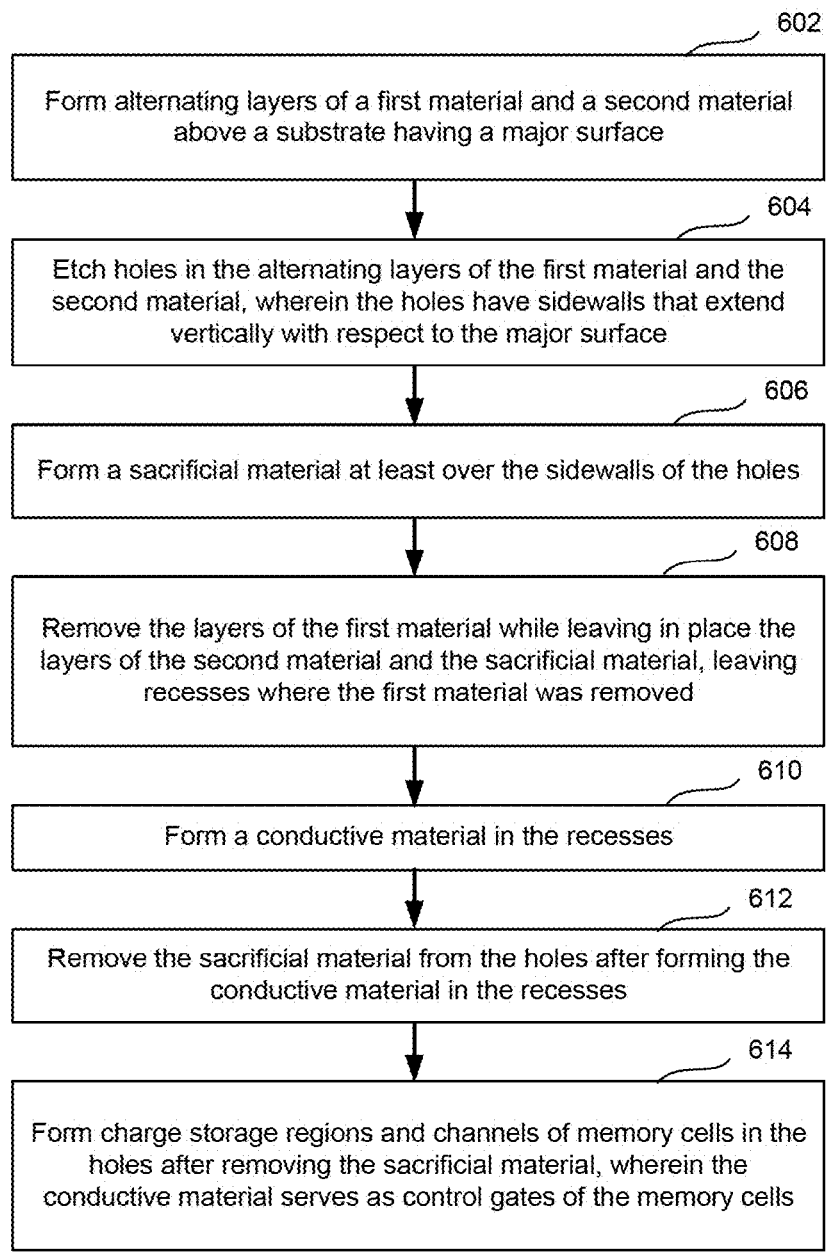
FIG. 6 is a flowchart of one embodiment of fabricating a 3D memory array.

FIG. 6 is a flowchart of one embodiment of fabricating a 3D memory array. Step 602 includes forming alternating layers of a first material and a second material above a substrate having a major surface. In one embodiment, the first material is a sacrificial material and the second material is an insulator. In one embodiment, these layers are ONON. In one embodiment, the substrate is substrate 101.

Step 604 includes etching holes (or openings) in the alternating layers of the first material and the second material. The holes have sidewalls that extend vertically with respect to the major surface of the substrate.

Step 606 includes forming a sacrificial material within the holes. In one embodiment, step 606 includes forming the sacrificial material at least over the sidewalls of the holes. Forming the sacrificial material over the sidewalls of the holes does not mean that the sacrificial material must be in direct contact with the sidewalls. There may be, for example, another layer of material between the sacrificial material and the sidewalls. In one embodiment, there is an etch stop layer between the sacrificial material and the sidewalls. In one embodiment, the sacrificial material is silicon nitride. In one embodiment, the sacrificial material is amorphous silicon. In one embodiment, the sacrificial material is polysilicon. Other materials may be used for the sacrificial material. In one embodiment, the sacrificial material is formed with an air gap within the sacrificial material. The air can help to speed the later removal of the sacrificial material.

Step 608 includes removing the layers of the first material while leaving in place the layers of the second material and the sacrificial material in the hole, leaving recesses where the first material was removed. For example, sacrificial layers of nitride are removed from an ONON stack.

Step 610 includes forming a conductive material in the recesses. In one embodiment, the conductive material is tungsten. Other materials can also be formed in the recesses. As one example a layer of titanium nitride can be formed in the recesses prior to forming tungsten in the recesses. The titanium nitride may block fluorine that may exist during the tungsten deposition from getting into the insulating layers between the tungsten layers. In one embodiment, an aluminum oxide layer is also formed in the recesses. This may be formed prior to depositing the conductive material (and also prior to depositing the titanium nitride).

Step 612 includes removing the sacrificial material from the holes after forming the conductive material in the recesses.

Step 614 includes forming memory films in the holes after removing the sacrificial material. This may include forming charge storage regions and channels of memory cells in the holes after removing the sacrificial material. Also, a block oxide may be formed in the holes prior to forming the charge storage regions. The conductive material may serve as control gates of the memory cells. Note that this process can prevent corner rounding of the control gates.

Figure 7A:
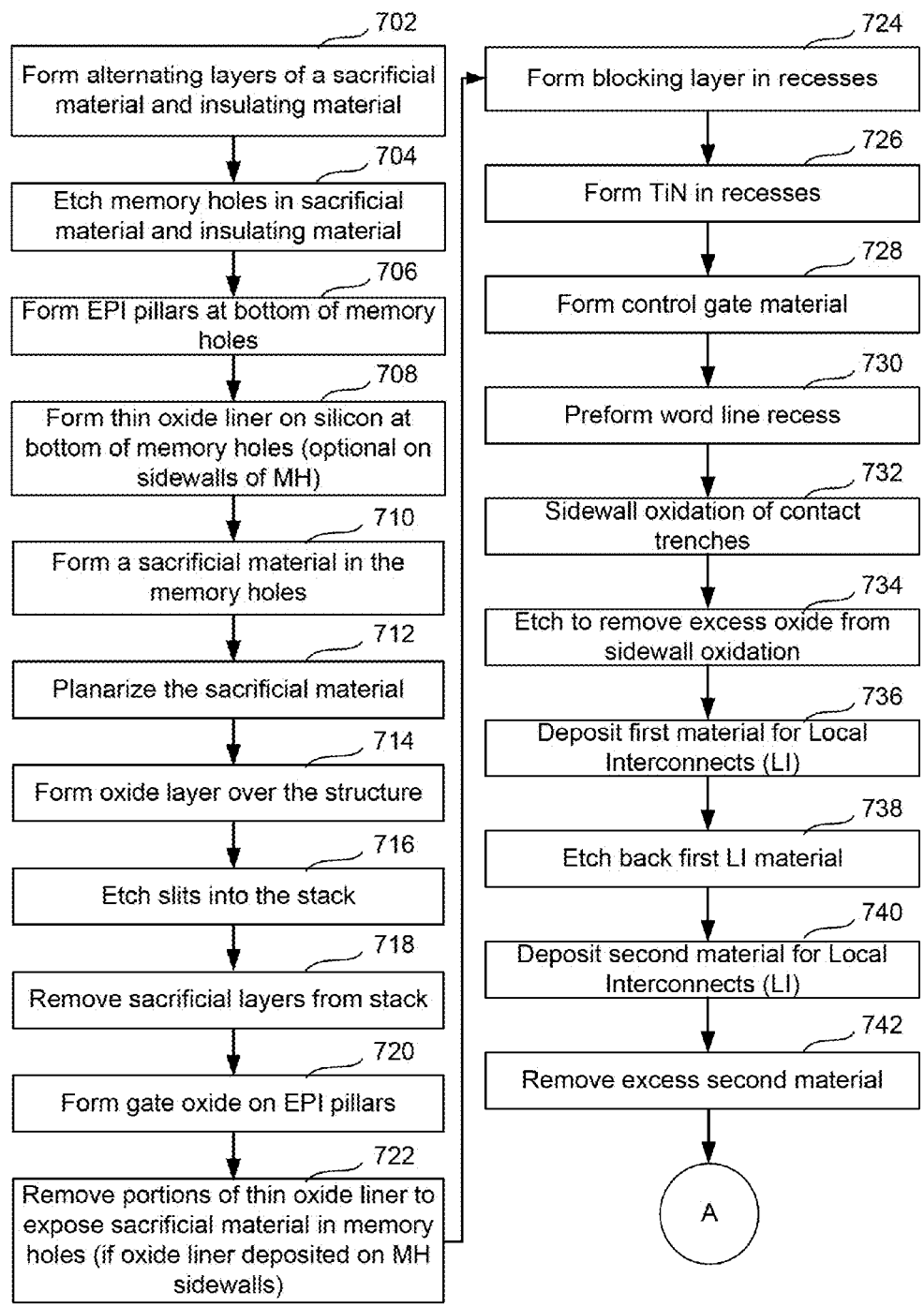
FIGS. 7A-7B depict a flowchart of one embodiment of fabricating a 3D memory array.
Figure 7B:
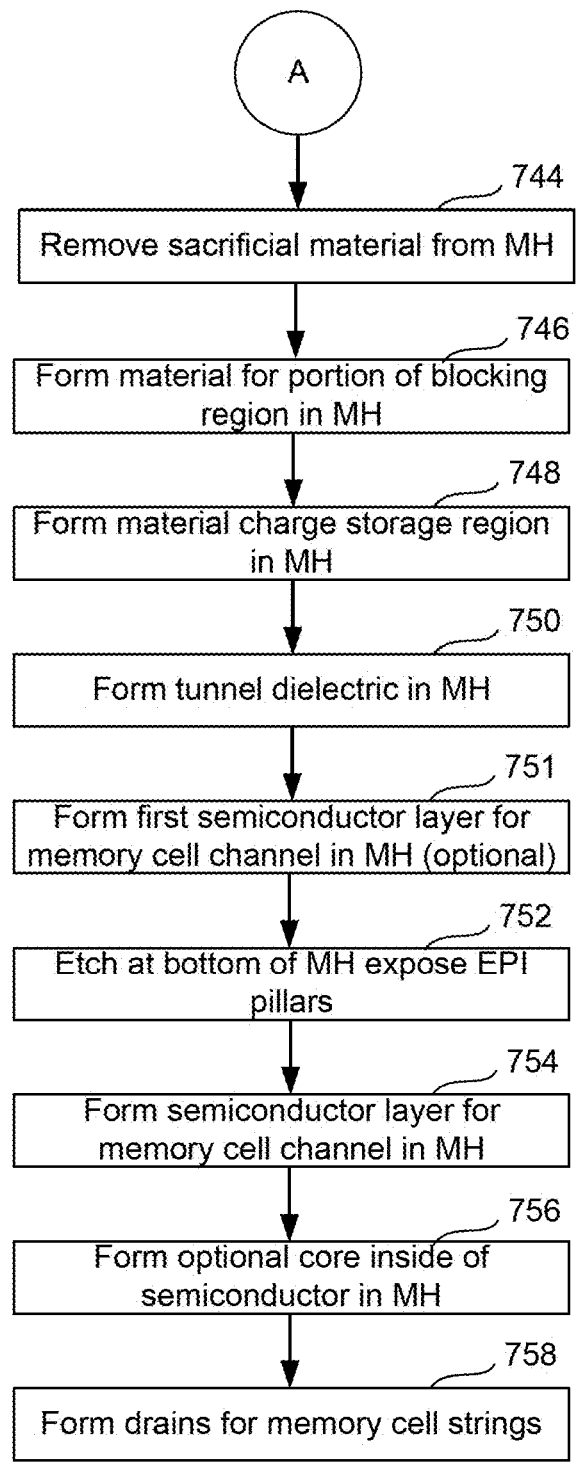
Figure 8A:
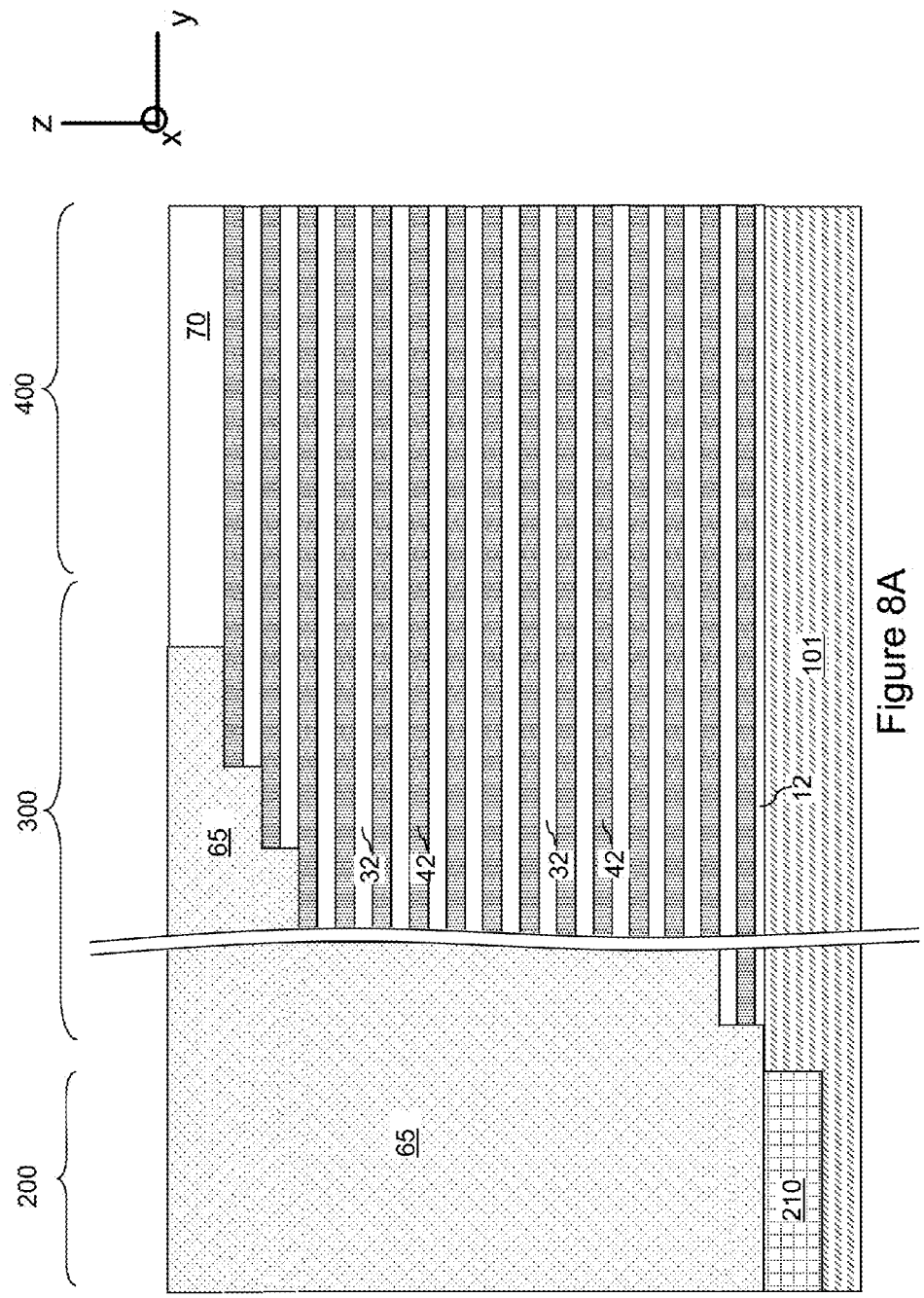
FIGS. 8A-8Z are diagrams illustrating results during embodiments of the process of FIG. 7.
Figure 8B:
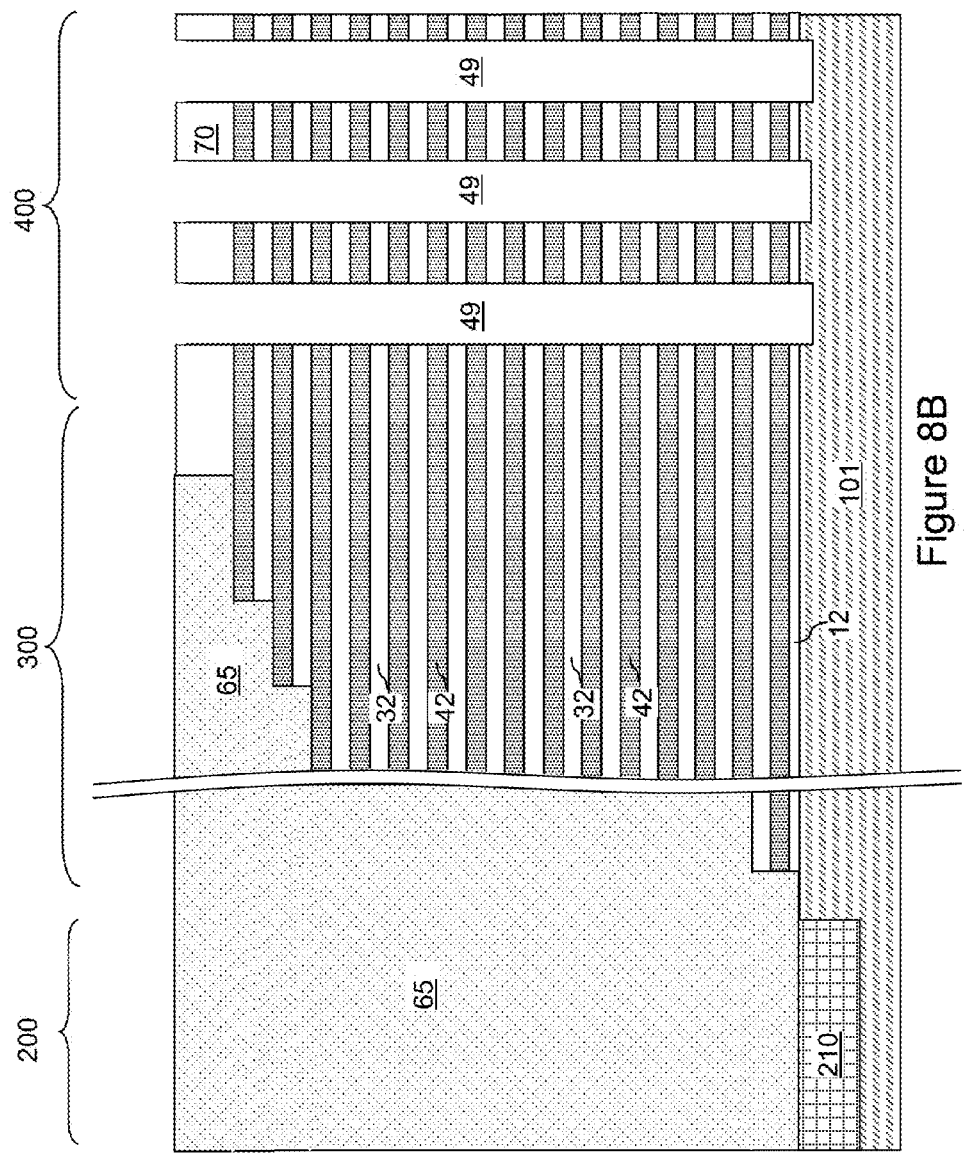
Figure 8C:
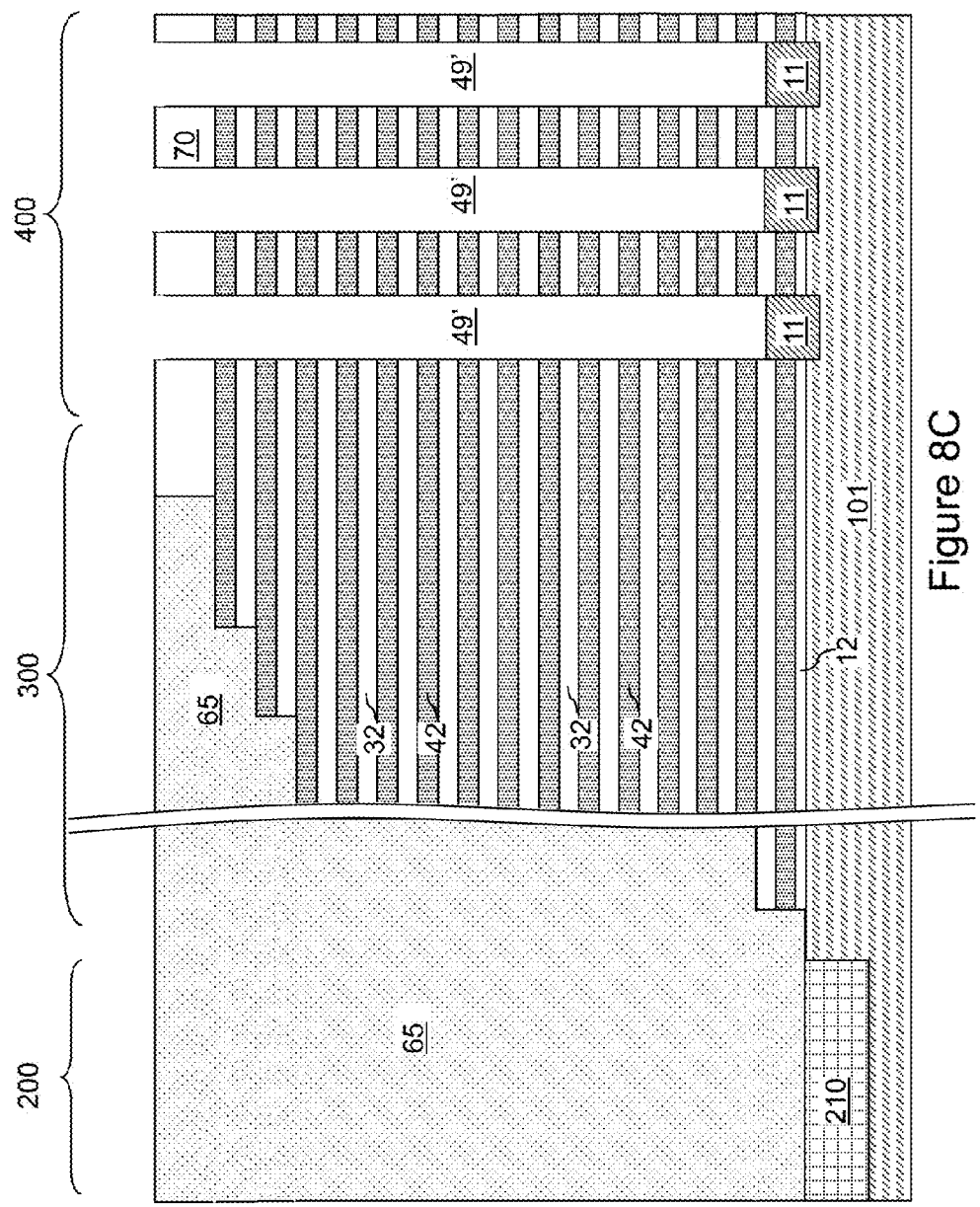

FIGS. 7A-7B depict a flowchart of one embodiment of fabricating a 3D memory array. FIGS. 7A-7B show further details of one embodiment of the process of FIG. 6. FIGS. 8A-8Z are diagrams illustrating results during embodiments of the process of FIGS. 7A-7B. Step 702 includes forming alternating layers of sacrificial material and insulating material. This is one embodiment of step 602 from the process of FIG. 6. In one embodiment, these layers are ONON. Results after one embodiment of step 702 are depicted in FIG. 8A. Referring to FIG. 8A, a first exemplary structure according to an embodiment of the present disclosure is illustrated, which can be employed, for example, to fabricate a device structure containing vertical NAND memory devices (such as vertical NAND strings). The first exemplary structure includes a substrate, which can be a semiconductor substrate (e.g., a semiconductor substrate, such as a single crystalline silicon wafer). The substrate can include a semiconductor substrate layer 101. The semiconductor substrate layer 101 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art. The substrate 101 has a major surface that extends in the x-y plane.

As used herein, a "semiconductor material" refers to a material having electrical conductivity in the range from $1.0\times10^{-6}$ S/cm to $1.0\times10^{5}$ S/cm, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. All measurements for electrical conductivities are made at the standard condition. The semiconductor substrate layer 101 can include at least one doped well (not expressly shown) having a substantially uniform dopant concentration therein.

The first exemplary structure can have multiple regions for building different types of devices. Such areas can include, for example, a device region 400, a contact region 300, and a peripheral device region 200. In one embodiment, the semiconductor substrate layer 101 can include at least one a doped well in the device region 400. As used herein, a "doped well" refers to a portion of a semiconductor material having a doping of a same conductivity type (which can be p-type or n-type) and a substantially same level of dopant concentration throughout. The doped well can be the same as the semiconductor substrate layer 101 or can be a portion of the semiconductor substrate layer 101. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0\times10^{15}/cm^{3}$ to $1.0\times10^{18}/cm^{3}$, although lesser and greater dopant concentration levels can also be employed. As used herein, a dopant concentration level refers to average dopant concentration for a given region.

Peripheral devices 210 can be formed in, or on, a portion of the semiconductor substrate layer 101 located within the peripheral device region 200. The peripheral devices can include various devices employed to operate the memory devices to be formed in the device region 400, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 101. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step. In one embodiment, insulating layers 32 each have a major surface that extends parallel to the major surface of the substrate 101. In one embodiment, the layers of sacrificial material 42 each have a major surface that extends parallel to the major surface of the substrate 101.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A stepped cavity can be formed within the contact region 300 and optionally in the peripheral device region 200 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 101. The alternating stack (32, 42) can be patterned such that each overlying insulator layer 32 has a lesser lateral extent than any of underlying insulator layers 32 within the alternating stack (32, 42). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide may be deposited in the stepped cavity and over the peripheral devices 210 in the peripheral device region 200. Excess portions of the deposited dielectric material can be removed from above the top surface of the insulating cap layer 70, for example, by chemical mechanical planarization (CMP). The remaining portion of the deposited dielectric material filling the stepped cavity in the contact region 300 and overlying the semiconductor substrate layer 101 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the insulating cap layer 70.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Step 704 includes etching memory holes in the alternating sacrificial and insulating layers. This is one embodiment of step 604 from the process of FIG. 6. The holes have sidewalls that extend vertically with respect to the major surface. Results after step 704 are depicted in FIG. 8B. Referring to FIG. 8B, a lithographic material stack (not shown) including at least a photoresist layer can be formed over the insulating cap layer 70 and the alternating stack (32, 42), and can be lithographically patterned to form openings in the device region 400. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings that extend through the alternating stack (32, 42). In one embodiment, the memory openings 49 extend perpendicular to the major surface of the substrate 101.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings can be substantially vertical, or can be tapered. The patterned lithographic material stack can be subsequently removed, for example, by ashing.

Each memory opening 49 extends through the insulating cap layer 70, the alternating stack (32, 42), and the gate dielectric layer 12, and optionally into an upper portion of the semiconductor substrate layer 101. The recess depth of the bottom surface of each memory opening 49 with respect to the top surface of the semiconductor substrate layer 101 can be in a range from 0 nm to 30 nm, although greater recess depths can also be employed.

Step 706 is forming a region of silicon in the bottom of the memory holes. In one embodiment, crystalline silicon is grown epitaxially. This may be referred to as growing silicon EPI pillars. This silicon could optionally be grown later in the process. FIG. 8C depicts results after step 706. Referring to FIG. 8C, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 101 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 101. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Step 708 includes depositing a thin oxide liner on top of the epitaxial channel portion 11. In one embodiment, the thin oxide liner serves as a protective material for the epitaxial channel portion 11. Optionally, the thin oxide liner is also formed on vertical sidewalls of the memory holes. In one embodiment, ALD is used. The oxide is about 40 Angstroms in one embodiment.

Step 710 includes depositing sacrificial material into the memory holes. In one embodiment, the sacrificial material is silicon nitride. In one embodiment, the sacrificial material is silicon (e.g., amorphous silicon, which may later be converted to polysilicon). Step 710 is one embodiment of step 606 from the process of FIG. 6. In one embodiment, the sacrificial material has an air gap. Results after step 710 are depicted in FIG. 8D.

Figure 8D:
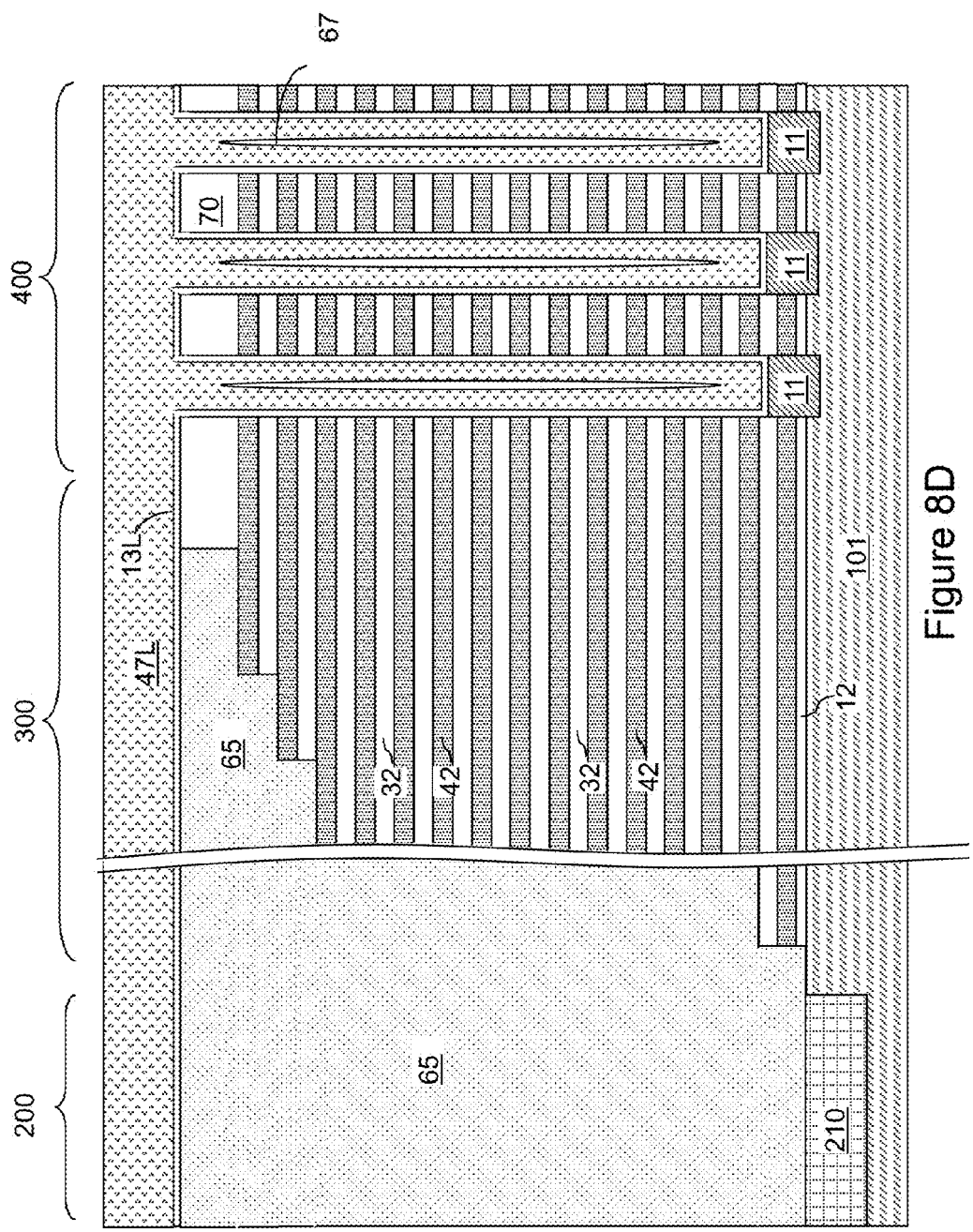

Referring to FIG. 8D, an optional conformal sacrificial material layer 13L including a first sacrificial material can be deposited on the sidewalls of the memory openings 49, on each top surface of the epitaxial channel portions 11, and over the insulating cap layer 70. The first sacrificial material can be a material different from the material of the sacrificial material layers 42 and from the material of the epitaxial channel portions 11. The first sacrificial material can be a material that can be removed selective to the semiconductor material of the epitaxial channel portions 11. For example, the first sacrificial material of the conformal sacrificial material layer 13L can be, for example, silicon oxide. Alternatively, amorphous carbon or a semiconductor material that provides a lower etch rate to an etch chemistry to be subsequently employed to remove the sacrificial material layers 42 can be employed may be employed as the first sacrificial material of the conformal sacrificial material layer 13L. In one embodiment, layer 13L is the thin oxide liner that was formed in step 708.

Subsequently, a sacrificial fill material layer 47L is deposited in the cavities 49', i.e., in the portions of the memory openings 49 that are not filled by the conformal sacrificial material layer 13L. The sacrificial fill material layer 47L includes a second sacrificial material. In one embodiment, the second sacrificial material of the sacrificial fill material layer 47L can be a non-conformal material layer, a self-planarizing material layer, or a conformal material layer. The second sacrificial material of the sacrificial fill material layer 47L can include a material that can be removed selective to the first sacrificial material of the conformal sacrificial material layer 13L. In one embodiment, the second sacrificial material of the sacrificial fill material layer 47L can include silicon nitride. In one embodiment, the second sacrificial material of the sacrificial fill material layer 47L can include polysilicon or amorphous silicon. In one embodiment, the sacrificial fill material layer 47L can be deposited by a non-conformal deposition method such as plasma enhanced chemical vapor deposition (PECVD) or low pressure chemical vapor deposition (LPCVD) having reactant depletion (i.e., insufficient reactant supply that results in non-conformal deposition). In this case, a cavity 67 can be present within each portion of the sacrificial fill material layer 47L in the memory openings 49. The cavity 67 may also be referred to as an air gap. The cavity 67 is not a requirement.

Figure 8E:
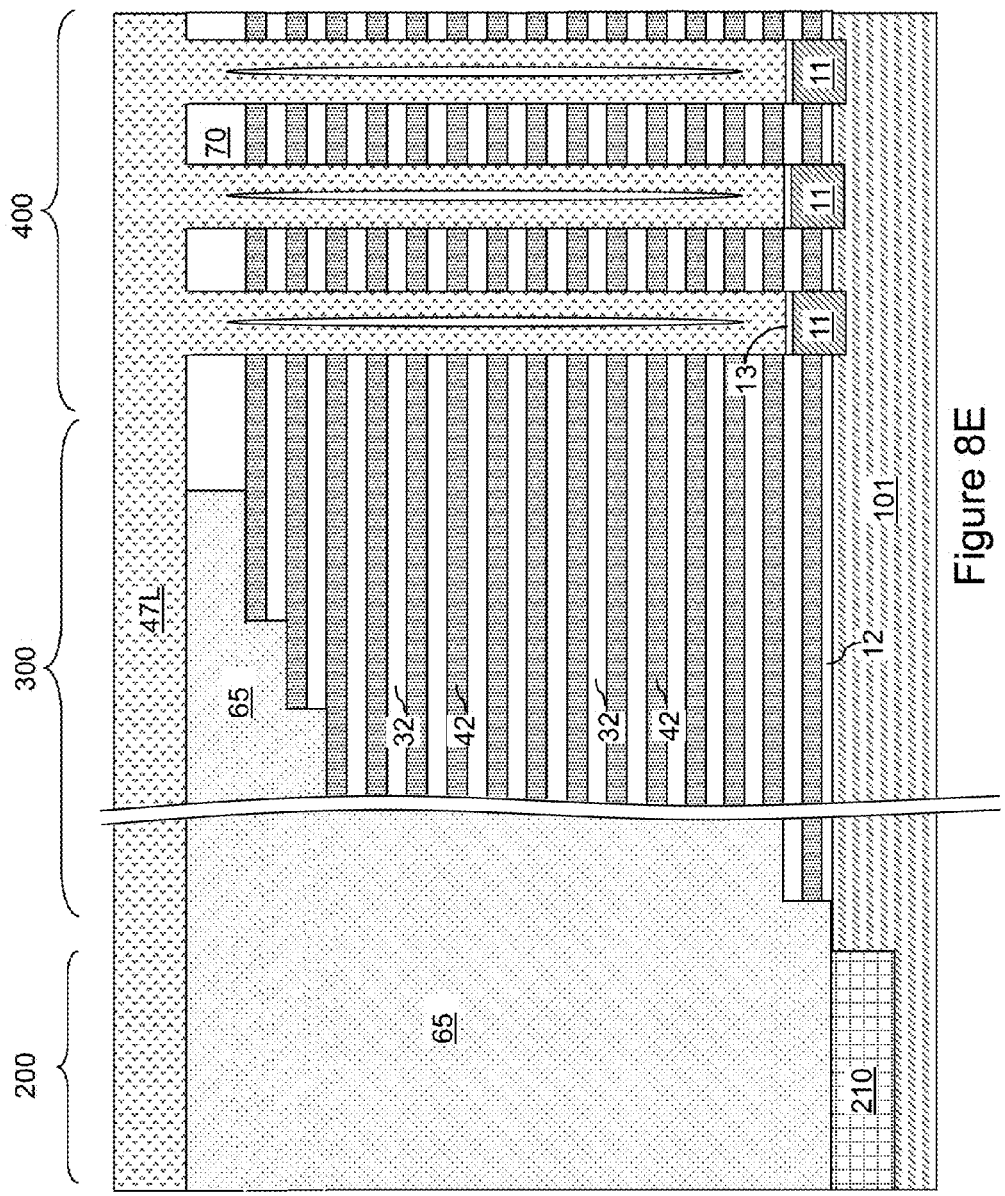

FIG. 8E depicts results after one embodiment of step 710. FIG. 8E depicts a variation in which the first sacrificial material is not present on the sidewalls of the memory holes. This may correspond to an embodiment in which the thin oxide liner is not formed on the sidewalls of the memory openings in step 708. Referring to FIG. 8E, a variation of the first exemplary structure is illustrated, which can be derived from the first exemplary structure of FIG. 8C by formation of sacrificial liners 13 and a sacrificial fill material layer 47L. The sacrificial liners 13 can be formed by oxidizing a surface portion of each epitaxial channel portion 11 into a semiconductor oxide portion while keeping the insulating layers 32 and the sacrificial material layers 42 unchanged. In one embodiment, the sacrificial liners 13 can be formed by conversion of the top portions of the epitaxial channel portions 11 into semiconductor oxide portions, for example, by thermal oxidation or plasma oxidation. In one embodiment, the sacrificial liners 13 can include silicon oxide, and can have a thickness in a range from 2 nm to 101 nm, although lesser and greater thicknesses can also be employed.

Figure 8F:
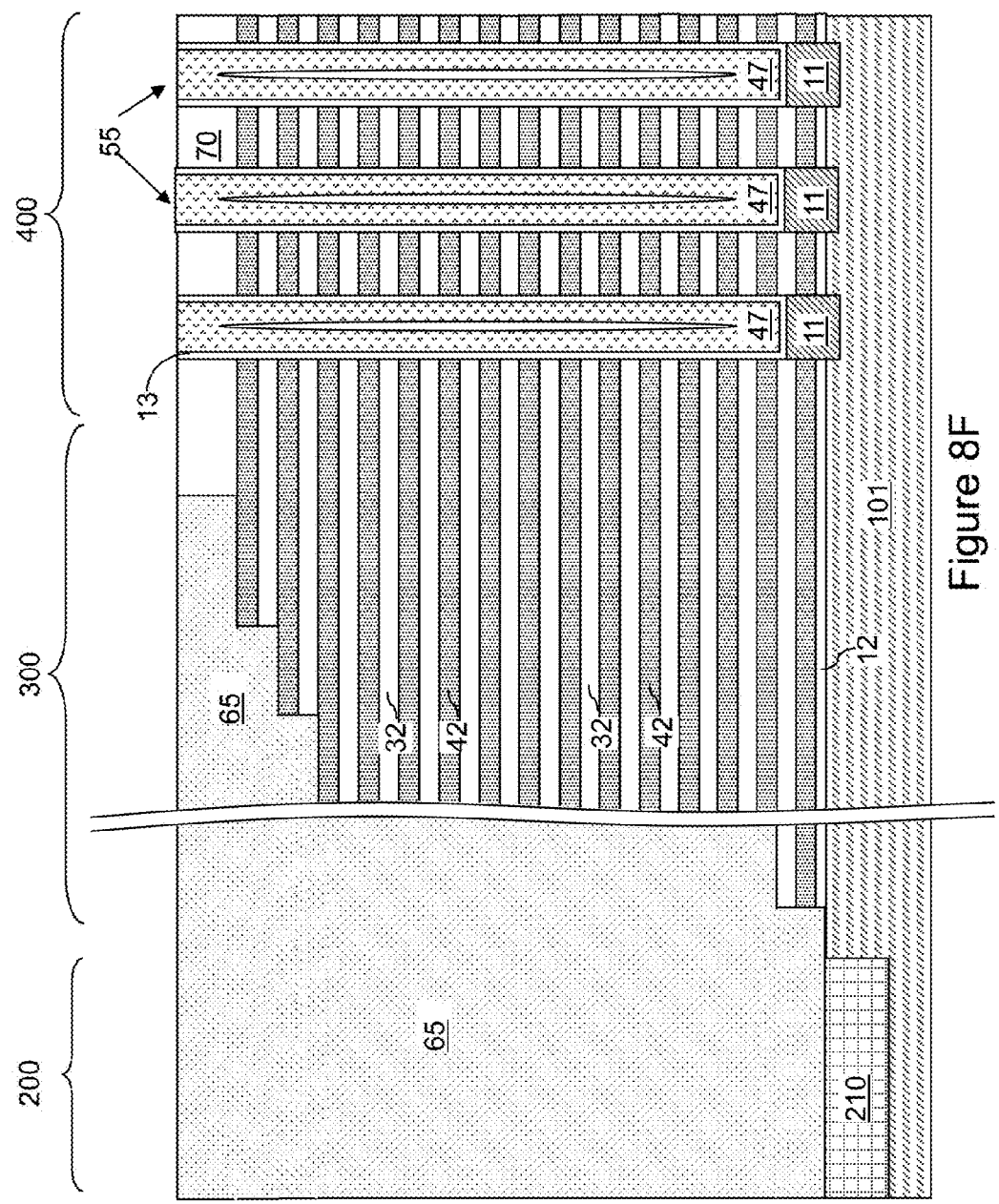

Step 712 includes performing a chemical mechanical polish (CMP) to planarize the sacrificial material that was deposited in step 710. FIG. 8F depicts results after one embodiment of step 712. This is consistent with the embodiment of FIG. 8D, which contains layer 13 on the sidewalls of the memory holes, and on the epitaxial channel portions 11. Referring to FIG. 8F, the sacrificial fill material layer 47L and the optional conformal sacrificial material layer 13L can be removed from above the top surface of the insulating cap layer 70 and the retro-stepped dielectric material portion 65 by a planarization process, which can include, for example, chemical mechanical planarization (CMP) and/or a recess etch. If a conformal sacrificial material liner 13L is employed, each remaining portion of the conformal sacrificial material liner 13L in a memory opening 49 constitutes a sacrificial liner 13. Each remaining portion of the sacrificial fill material layer 47L in a memory opening 49 constitutes a sacrificial fill material portion 47. Each sacrificial fill material portion 47 can include a vertically elongated cavity therein. Each pair of a sacrificial fill material portion 47 and a sacrificial liner 13 in a memory opening 49 constitutes a sacrificial memory opening fill structure (13, 47). This may also be referred to as a memory stack structure 55. Each memory stack structure 55 is formed over, and on, a top surface of an epitaxial channel portion 11.

Each sacrificial fill material portion 47 extends from a top surface of a horizontal portion of a respective sacrificial liner 13 to a horizontal plane including a top surface of the insulating cap layer 70. Thus, each sacrificial fill material portion 47 extends at least to a horizontal plane including a top surface of the alternating stack (32, 42). In one embodiment, the memory stack structure 55 can comprise a silicon-containing semiconductor material, which can be a material of the sacrificial fill material portions 47. In one embodiment, the memory stack structure 55 can comprise a nitride-containing semiconductor material, which can be a material of the sacrificial fill material portions 47.

Figure 8G:
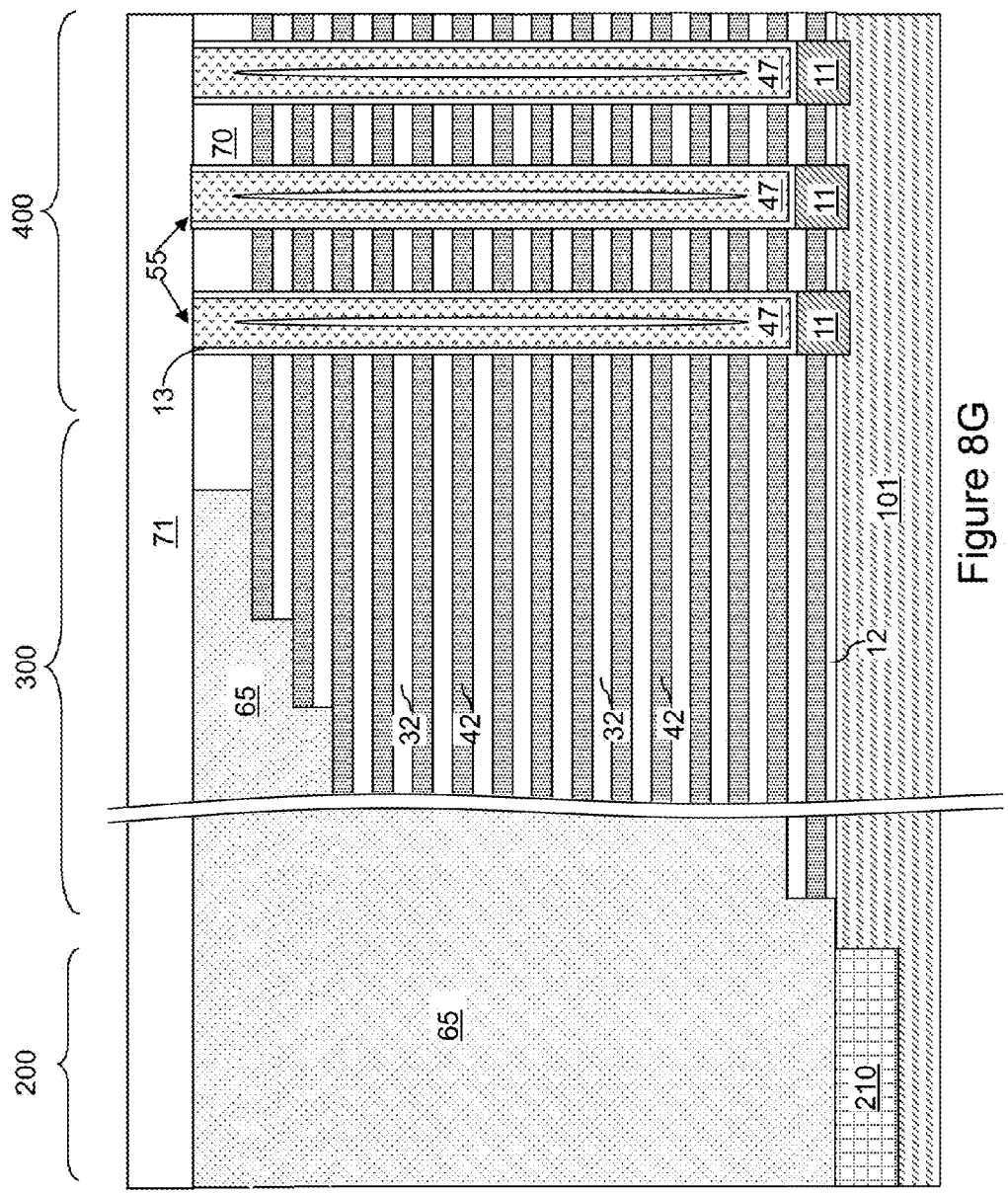

Step 714 includes forming an oxide layer over the structure. This serves as a protective layer for later process steps. FIG. 8G depicts results after one embodiment of step 714. Referring to FIG. 8G, a first contact level dielectric layer 71 can be optionally formed over the insulating cap layer 70, the sacrificial memory opening fill structures (13, 47), and the retro-stepped dielectric fill portion 65. The first contact level dielectric layer 71 includes a dielectric material that is different from the material of the sacrificial material layers 42. For example, if the sacrificial material layers 42 comprise silicon nitride, the first contact level dielectric layer 71 can include silicon oxide. The first contact level dielectric layer 71 can be formed, for example, by chemical vapor deposition. The thickness of the first contact level dielectric layer 71 can be in a range from 30 nm to 300 nm, although lesser and greater thicknesses can also be employed.

Figure 8H:
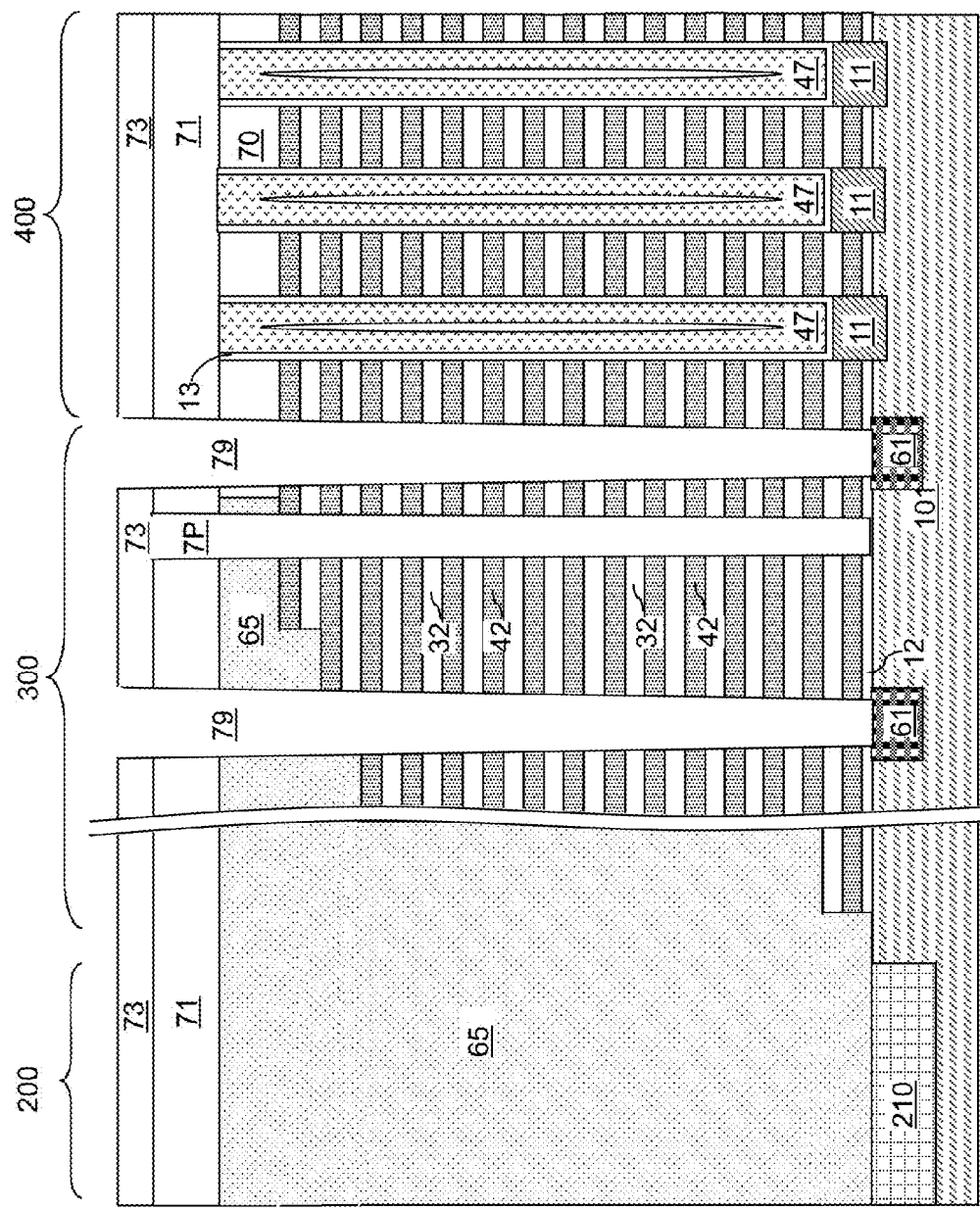
Figure 8I:
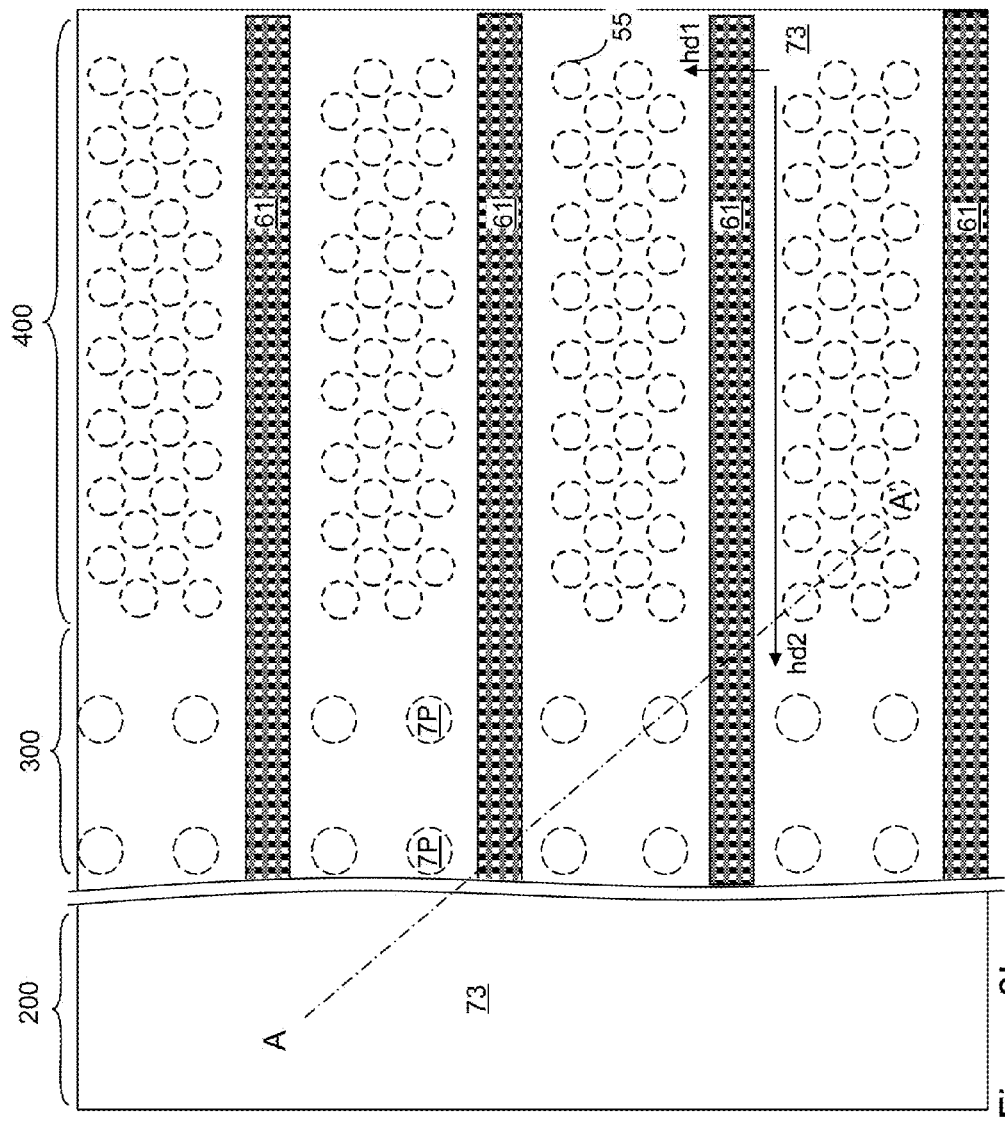

Step 716 includes etching slits into the stack. FIGS. 8H and 8I depict results after one embodiment of step 716. Referring to FIGS. 8H and 8I, the first exemplary structure is illustrated after formation of dielectric support pillars 7P and backside trenches 79. FIG. 8H is a vertical cross-sectional view along the plane A-A' of FIG. 8I. FIG. 8I is a see-through top-down view of the first exemplary structure of FIG. 8H, in which locations of the sacrificial memory opening fill structures (13, 47) are illustrated.

Dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 400. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

A photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the semiconductor substrate layer 101 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 101 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa. Note that the activation anneal for source regions 61 is done later in the process of some embodiments.

Note that ONON shrinkage is reduced or eliminated. A reason for this is that an in-situ steam generation (ISSG) process is not needed to oxide nitride. Note that some conventional processes may employ an ISSG process to oxide silicon nitride. Such an ISSG process could lead to ONON shrinkage, which can cause memory opening structures to tilt. However, embodiments prevent or reduce such ONON shrinkage. Therefore, the margin between the memory stack structures 55 and the local interconnects is improved. Also, word line deficit is reduced or prevented.

Figure 8J:
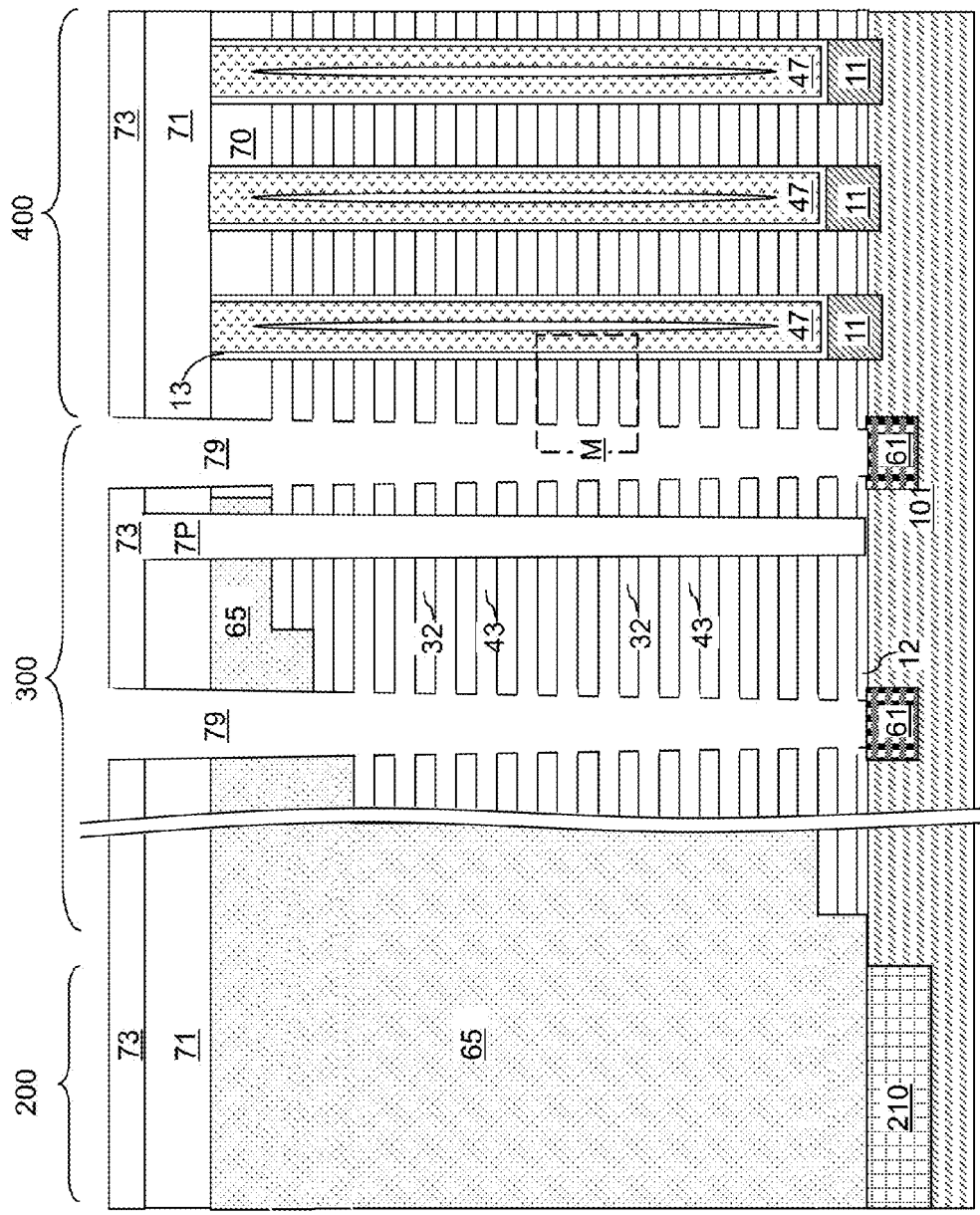

Step 718 includes removal of sacrificial layers in the ONON stack. For example, silicon nitride is removed in the ONON stack. Step 718 is one embodiment of step 608 from the process of FIG. 6. Results after one embodiment of step 718 are depicted in FIG. 8J. Referring to FIG. 8J, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. Backside recesses 43 are formed around the sacrificial memory opening fill structures (13, 47) (also referred to as memory stack structure 55) by removing the sacrificial material layers 42 selective to the insulator layers 32 through introduction of an etchant through the backside trenches 79. Removal of the sacrificial material layers 42 can be selective to the sacrificial memory opening fill structures (13, 47).

The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outer surfaces of the sacrificial memory opening fill structures (13, 47). Note that in one embodiment, material 13 is the material of the outer surfaces of the sacrificial memory opening fill structures. However, since material 13 is optional on the sidewalls of the memory holes, in one embodiment, material 47 is the material of the outer surfaces of the sacrificial memory opening fill structures.

In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor substrate layer 101.

The etch process that removes the second material selective to the first material and the sacrificial memory opening fill structures (13, 47) can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 400 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 101. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 8K:
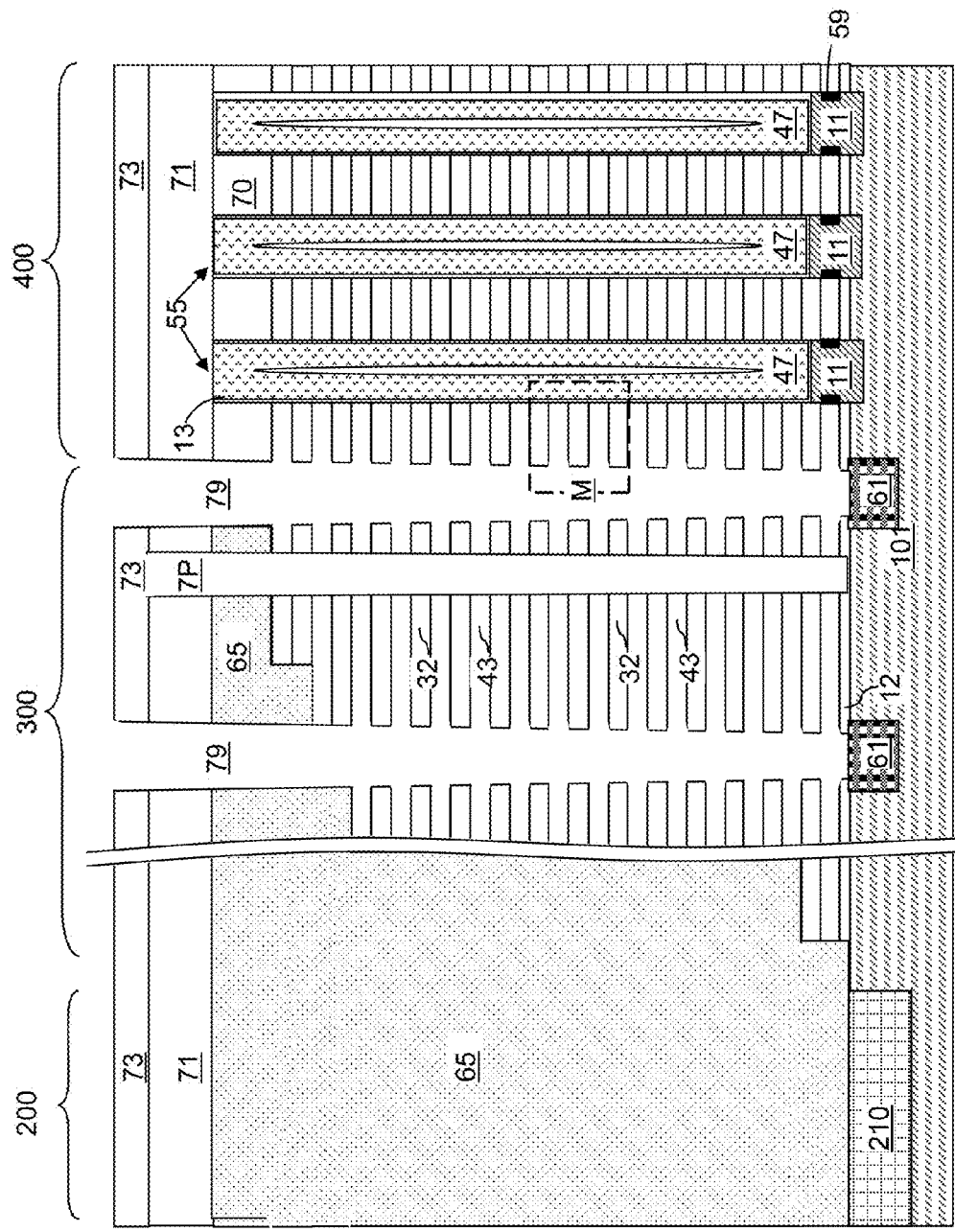

Step 720 includes oxidation of sidewalls of the epitaxial channel portions 11 to form gate oxides. Step 720 includes selectively oxidizing the epitaxial channel portions 11 without oxidizing the second sacrificial material 47, or the first sacrificial material 13 (if used). FIG. 8K depicted results after one embodiment of step 720. The gate oxide regions 59 are depicted on sidewalls of the epitaxial channel portions 11.

Step 720 may include converting a surface portions of the epitaxial channel portions 11 into a semiconductor oxide portion, a semiconductor nitride portion, or a semiconductor oxynitride portion by oxidation, nitridation, or a combination of oxidation and nitridation, of the physically exposed portions of the epitaxial channel portions 11. In one embodiment, the dielectric spacers 59 can be semiconductor oxide spacers that are formed around the epitaxial channel portions 11 by oxidizing a sidewall portion of each epitaxial channel portion 11 after formation of the backside recesses 43. The dielectric spacers 59 may be annular spacers that laterally surround a respective epitaxial channel portion 11.

Optional step 722 includes removal of portions of the thin oxide liner 13 that was optionally deposited on the sidewalls of the memory holes in step 708. After step 722, sacrificial material 47 is exposed adjacent to the recesses 43'. Note that the portions of the thin oxide liner 13 that is on the top of the epitaxial channel portion 11 may remain in place. Also note that portions of the thin oxide liner 13 that reside between the insulating layers 32 and sacrificial material 47 may remain in place. However, portions of the thin oxide liner 13 that are adjacent to the recesses 43' may be removed.

Step 724 is depositing a first portion of a blocking layer. In this embodiment, this is deposited into the recesses 43. This will serve as at least a portion of a blocking dielectric between the control gate and the charge storage region, in one embodiment. In this embodiment, the blocking layer is formed form a dielectric material. In one embodiment, this blocking layer is aluminum oxide ($Al_2O_3$). However, a different material could be used. Also note that the complete blocking layer can include additional materials, which may be formed at this step or at another step in the process.

Figure 8L:
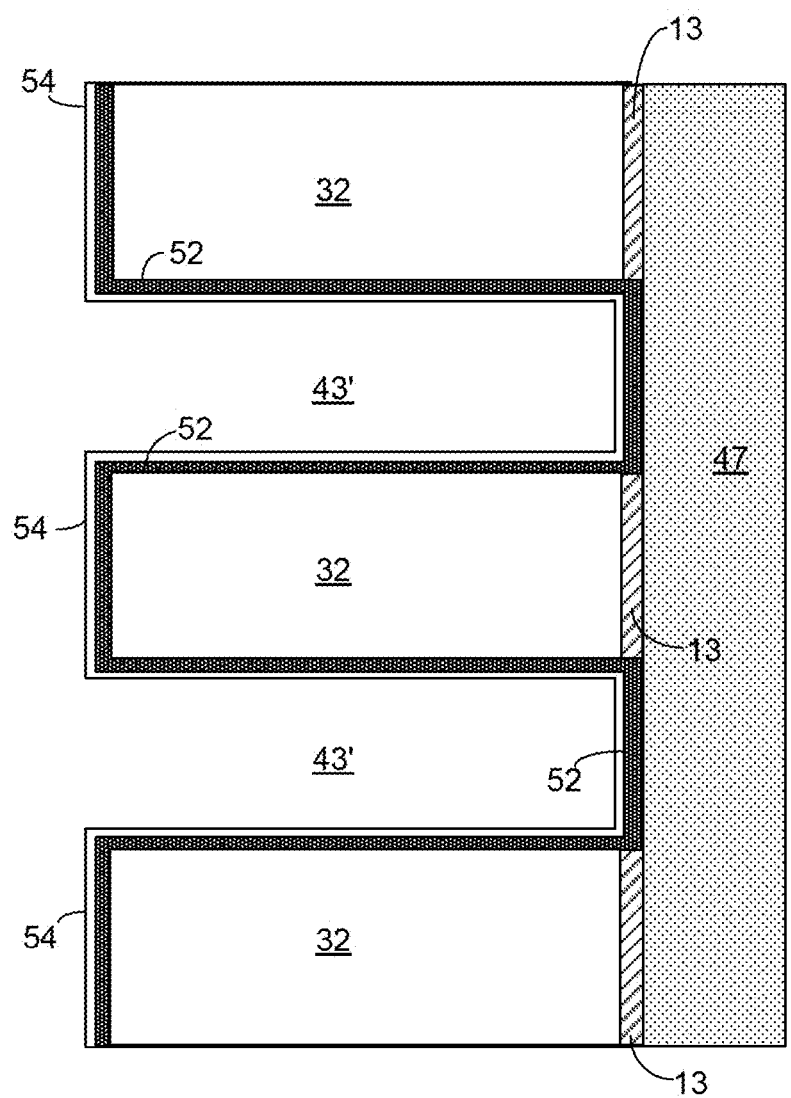

Step 726 is depositing titanium nitride in the recesses 43. FIG. 8L is a vertical cross-sectional view of a magnified region M from FIG. 8K, after step 726. Referring to FIG. 8L, a portion of the first exemplary structure is illustrated after deposition of a backside blocking dielectric layer 52, which is also referred to as a first blocking dielectric layer or an outer blocking dielectric layer. The backside blocking dielectric layer 52 is an outer blocking dielectric layer that is formed in the backside recesses 43 and on the physically exposed surfaces of the sacrificial memory opening fill structures 47. In one embodiment, the backside blocking dielectric layer 52 includes a dielectric metal oxide such as aluminum oxide. The backside blocking dielectric layer 52 can be deposited, for example, by atomic layer deposition (ALD). In one embodiment, the backside blocking dielectric layer 52 can be deposited as an amorphous material, and can be subsequently annealed to form a polycrystalline dielectric metal oxide material. The thickness of the backside blocking dielectric layer 52 can be in a range from 1 nm to 6 nm, although lesser and greater thicknesses can also be employed. FIG. 8L also depicts layer 54, which resides on the backside blocking dielectric layer 52. In one embodiment, layer 54 is titanium nitride.

Figure 8M:
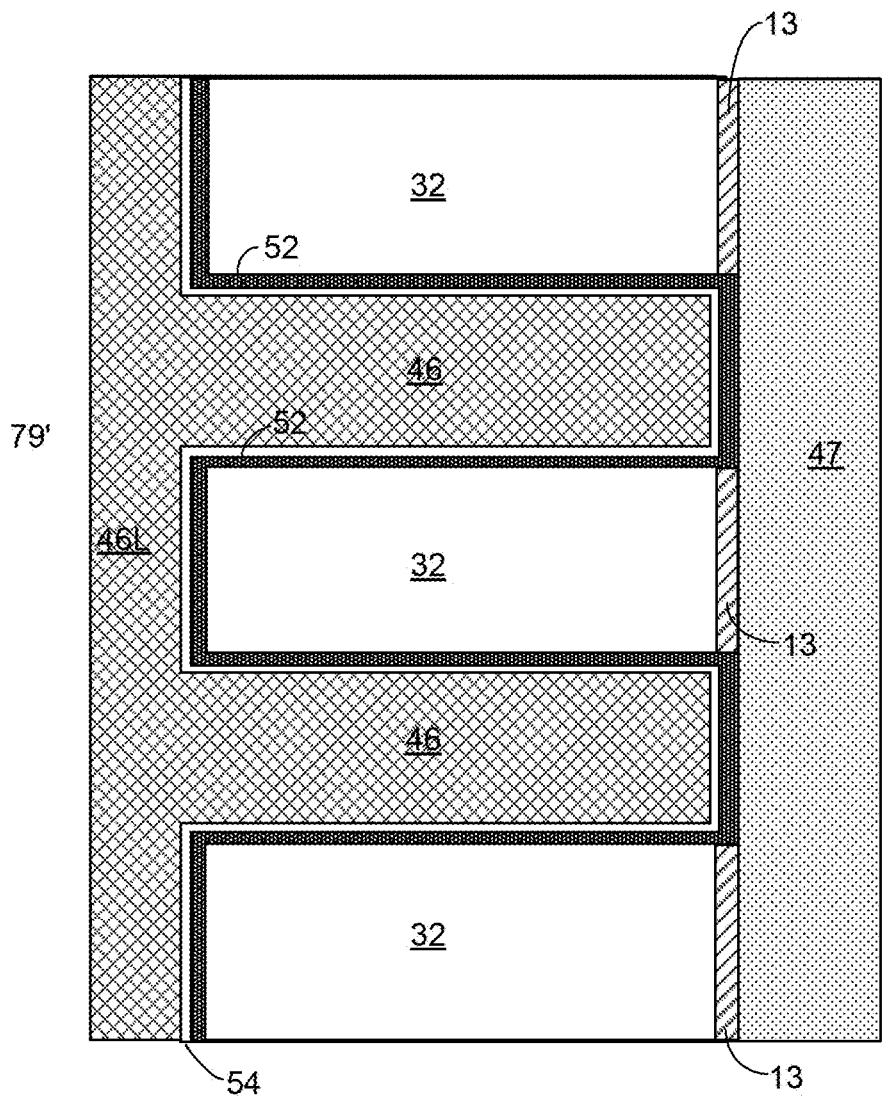

Step 728 includes depositing material in the recesses 43' for control gates of memory cells. In one embodiment, tungsten is deposited. Step 728 is one embodiment of step 610 from the process of FIG. 6. FIG. 8M depicts results after one embodiment of step 728. Referring to FIG. 8M, at least one conductive material can be deposited in the backside recesses 43' and over the sidewalls of the backside trenches 79. Electrically conductive layers 46 can be formed in the backside recesses 43, and a contiguous metallic material layer 46 can be formed on the sidewalls of each contact trench 79 and over the at least one contact level dielectric layer (71, 73). Thus, each sacrificial material layer 42 can be replaced with an electrically conductive layer 46. A backside cavity 79' is present in the portion of each contact trench 79 that is not filled with the contiguous metallic material layer 46L. Each electrically conductive layer 46 can be formed in a respective backside recess 43 and on surfaces of the backside blocking dielectric layer 52.

The at least one metallic material can comprise at least one metallic material. The at least one metallic material can be deposited by a conformal deposition method, which can be, for example, chemical vapor deposition (CVD), atomic layer deposition (ALD), electroless plating, electroplating, or a combination thereof. The at least one metallic material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses 43 include tungsten, tungsten nitride, titanium, titanium nitride, tantalum, tantalum nitride, cobalt, and ruthenium. In one embodiment, the at least one metallic material can comprise a metal such as tungsten and/or metal nitride. In one embodiment, the at least one metallic material for filling the backside recesses 143 can include a combination of titanium nitride layer 54 and a tungsten fill material. In one embodiment, the at least one metallic material can be deposited by chemical vapor deposition or atomic layer deposition.

Figure 8N:
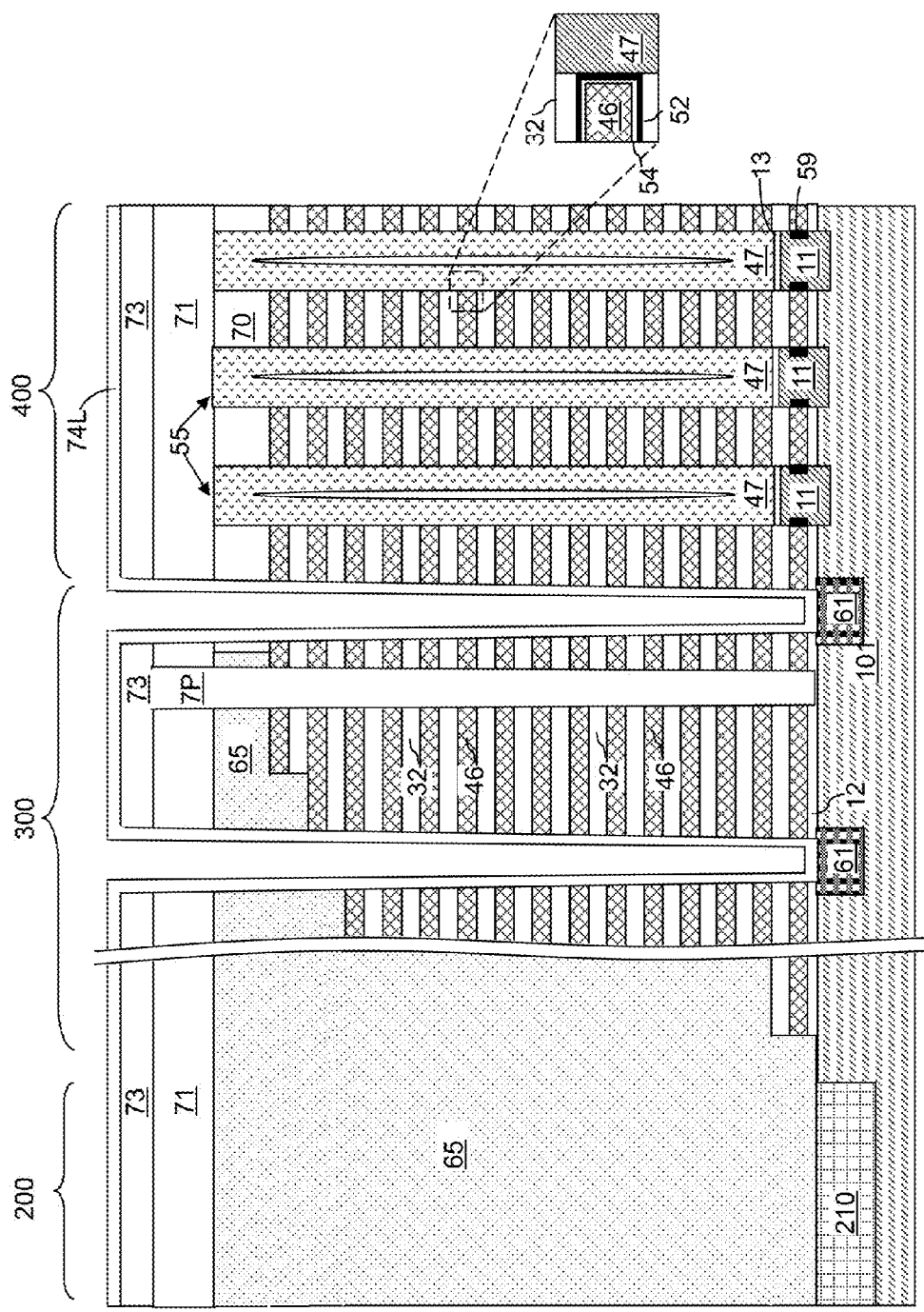

Step 730 includes performing a word line recess. This step removes portions of material 46L in order to separate the word lines (or control gates) of the different layers. Step 732 includes a sidewall oxide deposition to form oxide liners in contact trenches 79. FIG. 8N depicts results after one embodiment of step 732. Referring to FIG. 8N, the deposited metallic material of the contiguous metallic material layer 46L is etched back from the sidewalls of each contact trench 79 and from above the at least one contact level dielectric layer (71, 72), for example, by an isotropic etch. The electrically conductive layers 46 in the backside recesses 43 remain without being etched. Each electrically conductive layer 46 can be a conductive line structure, and can be employed as a combination of a control gate electrode and a word line, a combination of a source select gate electrode and a source select line, or a combination of a drain select gate electrode and a drain select line. Thus, each sacrificial material layer 42 can be replaced with an electrically conductive layer 46.

FIG. 8N also shows a conformal insulating layer 74L deposited on the sidewalls of the backside trenches 79 and over the at least one contact level dielectric layer (71, 73). The conformal insulating layer includes an insulating material such as silicon oxide, silicon nitride, or a dielectric metal oxide. The thickness of the conformal insulating layer 74L is less than one half of the minimum lateral dimension between opposing sidewalls of the backside trenches 79.

FIG. 8N also shows a magnified region showing electrically conductive layer (for control gate) 46, titanium nitride 54, first blocking dielectric layer 52, sacrificial material 47, and insulating layers 32. FIG. 8N shows that the electrically conductive layers 46 have filled in the recesses 43. Note that the optional thin oxide layer 13 is not depicted on the sidewalls of memory structures 55 in FIG. 8N. This optional thin oxide layer 13, if used, was removed such that it will not exist between first blocking dielectric layer 52 and sacrificial material 47. A reason for its removal is that it may be of poor quality for a blocking layer. Some portions of optional thin oxide layer 13 may remain between insulating region 32 and sacrificial material 47. However, those portions are not depicted. Also, the portions of thin oxide layer 13 that are over the epitaxial channel portion 11 may remain in place.

Figure 8O:
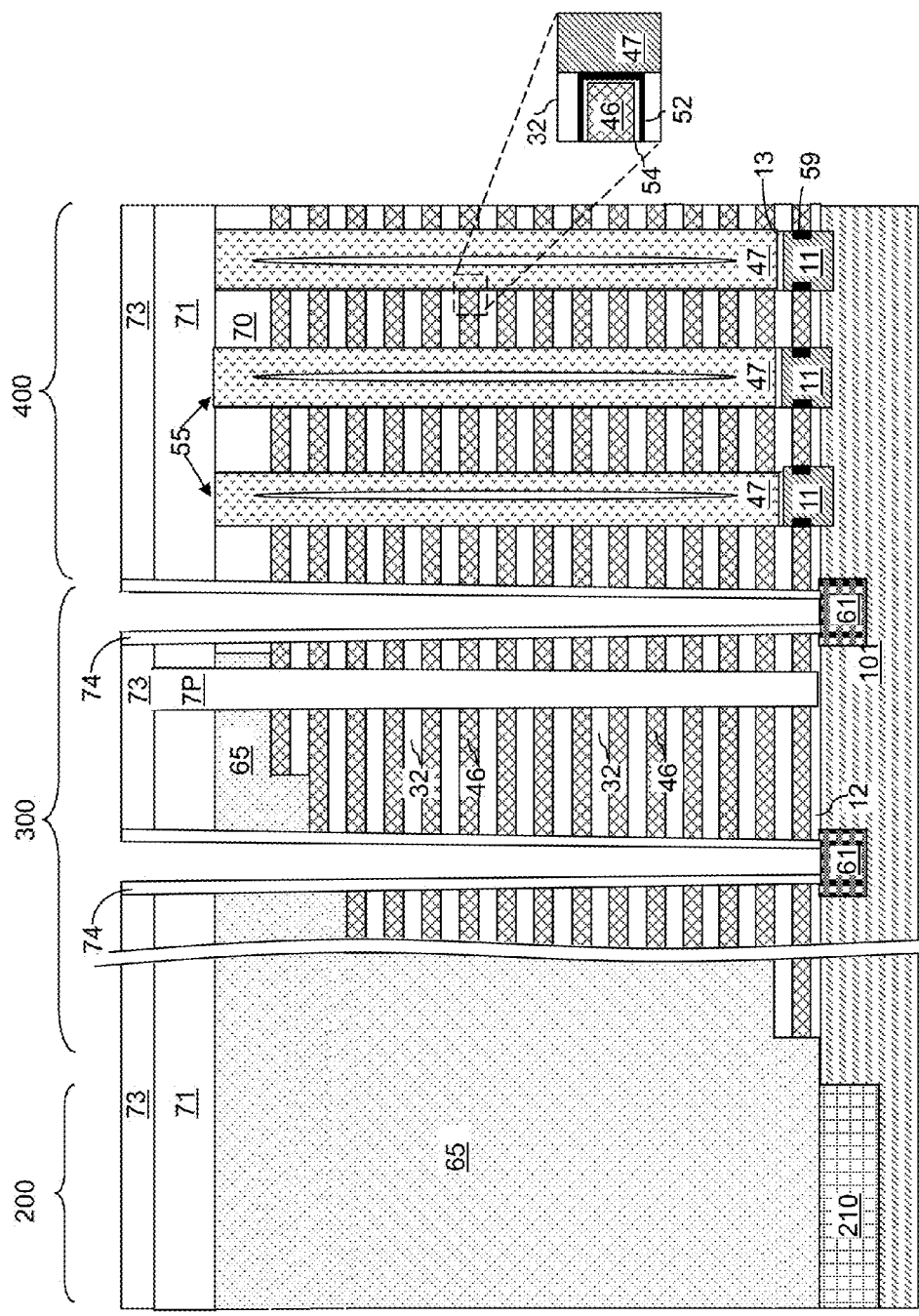

Step 734 includes anisotropic etch to remove horizontal portions of material 74L, which reside on the top layer 73. Each remaining vertical portion of the conformal insulating layer 74L constitutes an insulating spacer 74. FIG. 8O shows results after one embodiment of step 734.

Figure 8P:
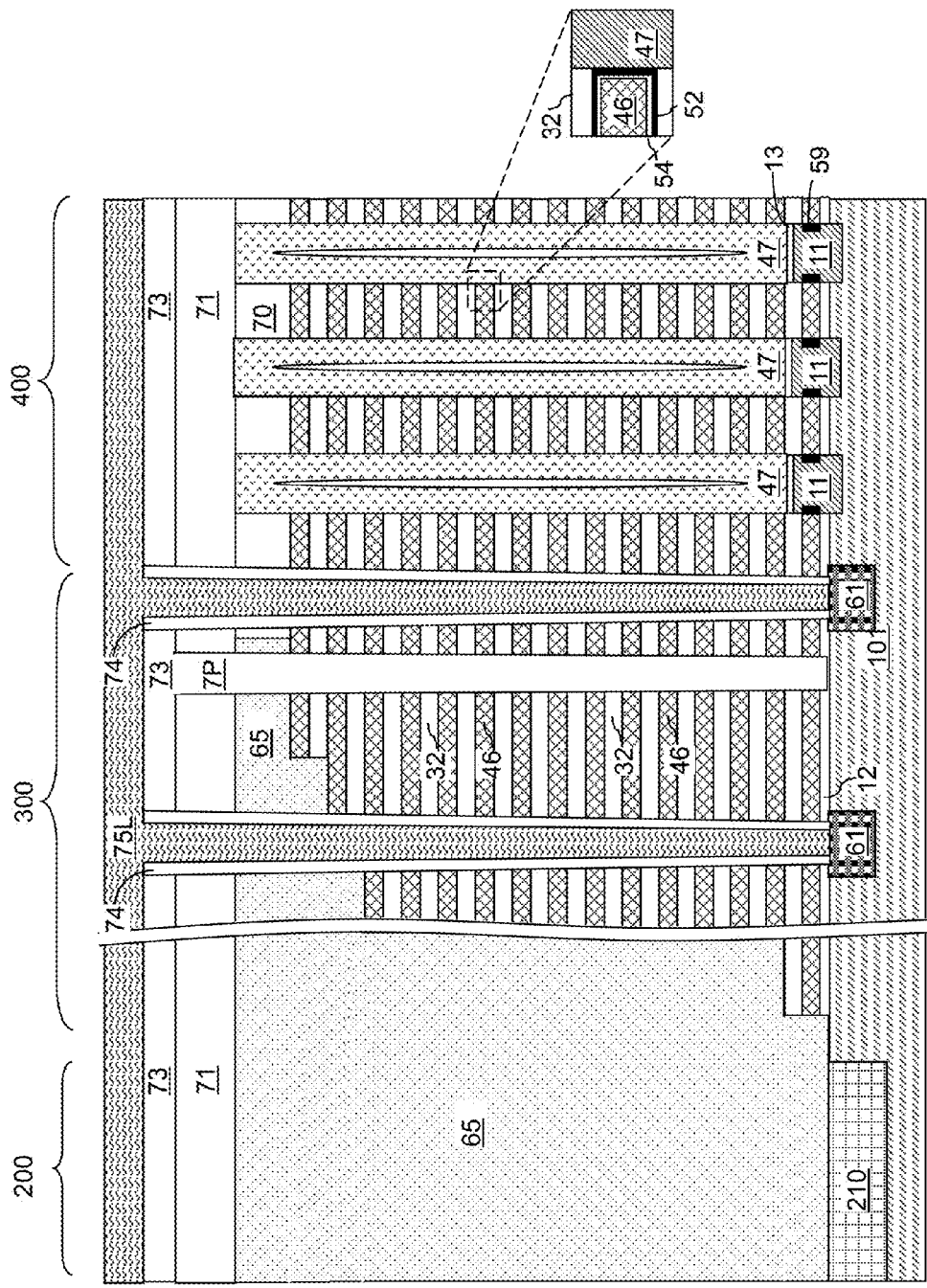

Step 736 includes depositing material for local interconnects. FIG. 8P shows results after one embodiment of step 736. Referring to FIG. 8P, a first conductive fill material is deposited in the cavities within the insulating spacers 74 and over the at least one contact level dielectric layer (71, 73) to form a first conductive fill material layer 75L. In one embodiment, the first conductive fill material can include a doped semiconductor material such as doped polysilicon.

Figure 8Q:
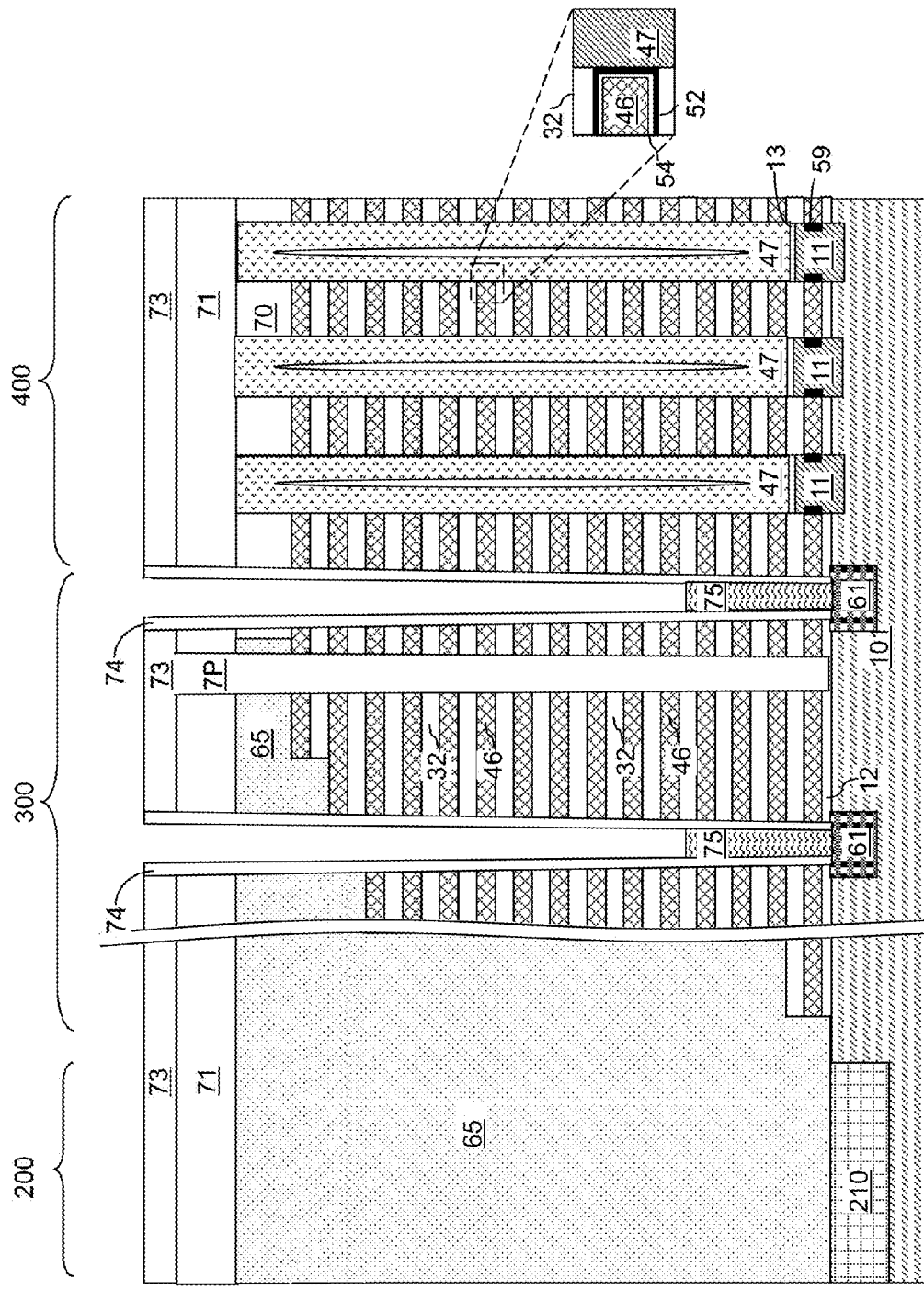

Step 738 includes an etch back of the material deposited in step 736. FIG. 8Q shows results after one embodiment of step 738. Referring to FIG. 8Q, the first conductive fill material is recessed to remove horizontal portions of the first conductive fill material layer 45L from above the top surface of the at least one contact level dielectric layer (71, 73). The first conductive fill material is further recessed below the horizontal plane including the topmost surface of the alternating stack (32, 46) of the insulating layers 32 and the electrically conductive layers 46. Each remaining portion of the first conductive fill material constitutes a lower contact via structure portion 75 that contacts a respective source region 61.

Step 740 includes depositing a second material for local interconnects. FIG. 8R depicts results after one embodiment of step 740. Referring to FIG. 8R, a second conductive fill material is deposited in the cavities over the lower contact via structure portions 75 within the insulating spacers 74 and over the at least one contact level dielectric layer (71, 73) to form a second conductive fill material layer 76L. In one embodiment, the second conductive fill material can include at least one metallic material such as a combination of a conductive metallic nitride material (such as TiN) and a metal (such as W, Co, or Ru).

Figure 8S:
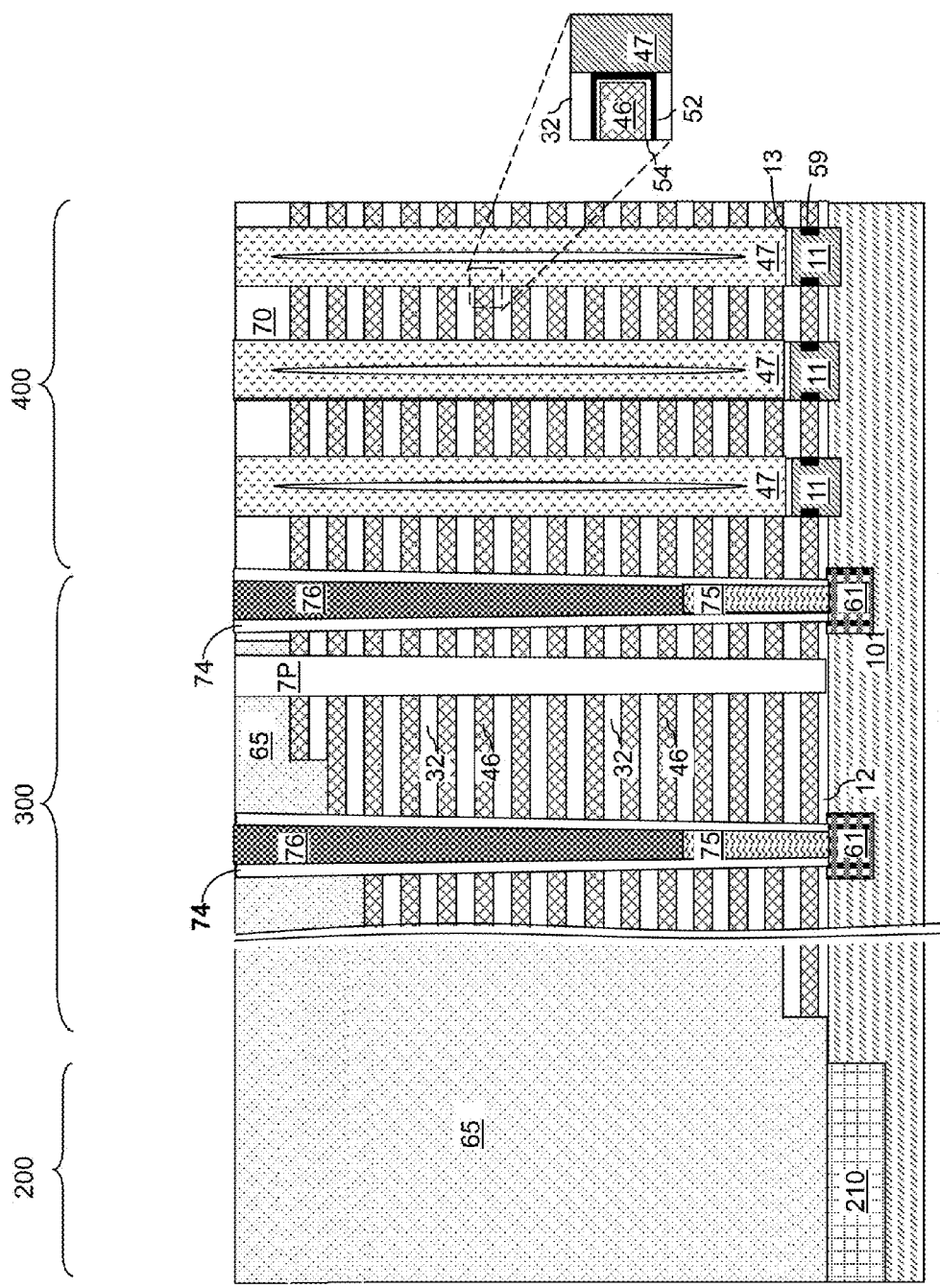

Step 742 includes removing some of the second material at the top of the structure. FIG. 8S depicts results after one embodiment of step 742. Referring to FIG. 8S, the portion of the second conductive fill material above the top surface of the at least one contact level dielectric layer (71, 73) can be removed by a planarization process such as chemical mechanical planarization (CMP) and/or a recess etch. Additionally, layers 71 and 73 may be removed. Each remaining portion of the second conductive fill material constitutes an upper contact via structure portion 76 that contacts a respective lower contact via structure 75. Each vertically adjoining pair of a lower contact via structure portion 75 and an upper contact via structure portion 76 constitutes a backside contact via structure (75, 76), which is a contact via structure that provides electrical contact with the respective underlying source regions 61.

Figure 8T:
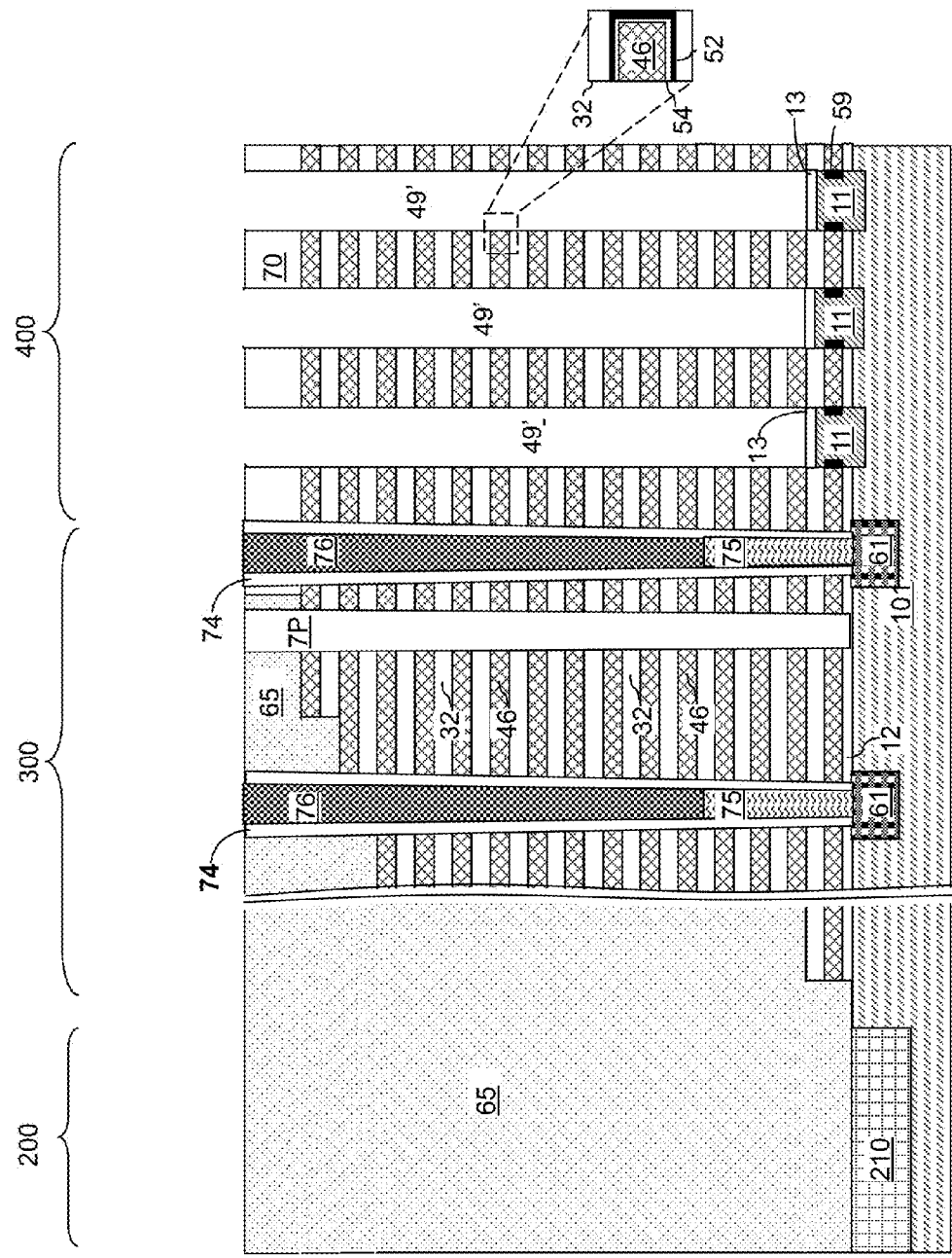
Figures 8U, 8V:
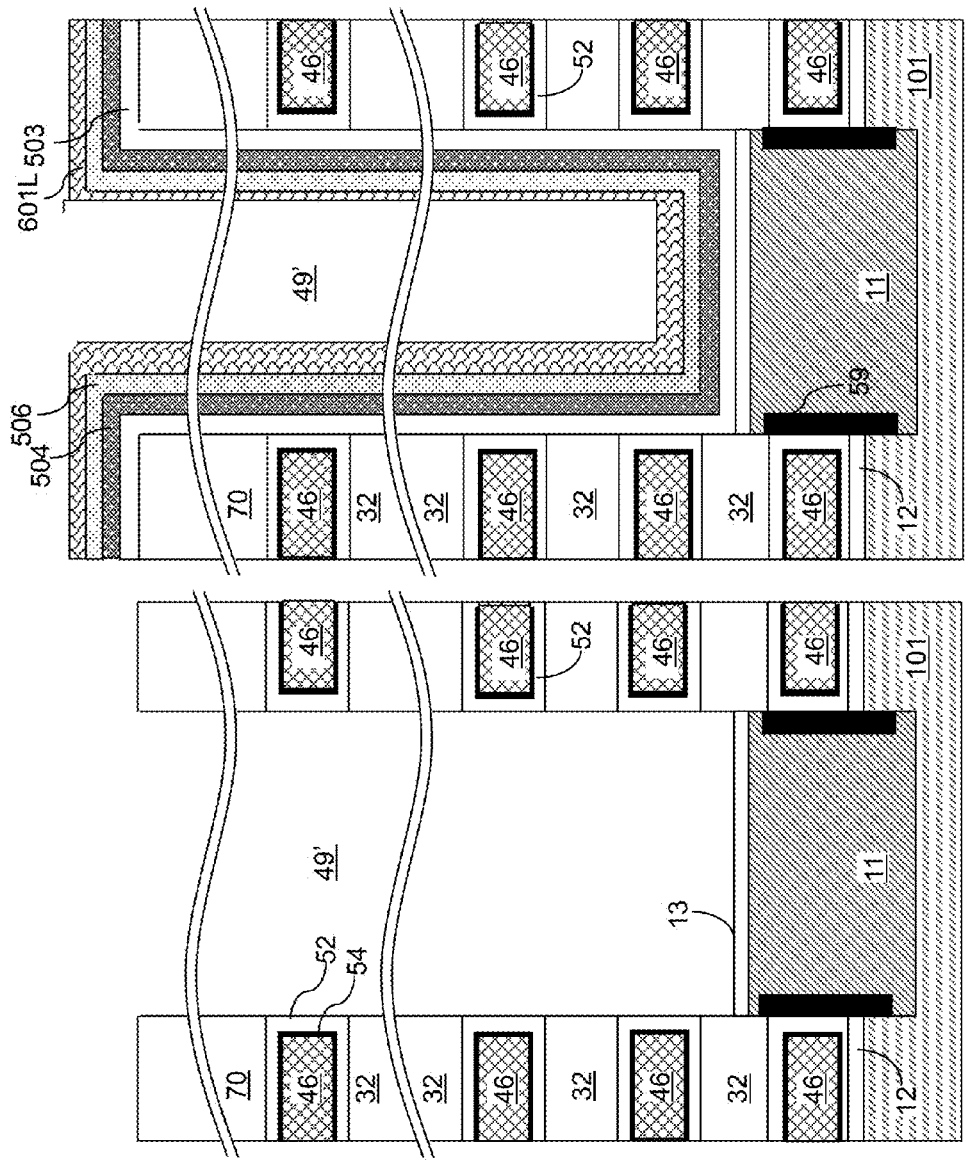

Step 744 includes removing sacrificial material from the memory holes. Step 744 is one embodiment of step 612 from the process of FIG. 6. FIG. 8T depicts results after one embodiment of step 744. Referring to FIGS. 8T and 8U, each sacrificial memory opening fill structure (47) is removed from a respective memory opening to form a memory cavity 49' overlying thin oxide layer 13 over respective epitaxial channel portion 11. Each sacrificial fill material portion 47 can be removed selective to the selective to the insulating layers 32 and the backside blocking dielectric layer 52. In one embodiment, step 744 includes removing silicon nitride as the sacrificial memory opening fill structure 47. Hot phosphorous is used to remove the silicon nitride, in one embodiment. In one embodiment, step 744 includes removing silicon as the sacrificial memory opening fill structure 47. Recall that a thin oxide liner 13 was formed on top of the epitaxial channel portion 11 in step 708. The thin oxide liner 13 may remain in place.

In one embodiment, the sacrificial liners 13 can extend from a respective epitaxial channel portion 11 to a topmost layer within the alternating stack (32, 46) of insulating layers 32 and electrically conductive layers 46. In this case, the removal of the sacrificial fill material portion 47 can be performed employing an etch chemistry that is selective to the material of the sacrificial liners 13. In an illustrative example, a sacrificial fill material portion 47 comprising polysilicon can be removed by a wet etch employing KOH selective to a sacrificial liner 13 comprising silicon oxide. Subsequently, each sacrificial liner 13 can be removed selective to the epitaxial channel portions 11, the insulator layers 32, and the backside blocking dielectric layer 52.

In another embodiment, the sacrificial liners 13 can be semiconductor oxide portions formed by oxidation of surface portions of the epitaxial channel portions 11. In this case, the sacrificial fill material portions 47 contact sidewalls of the insulator layers 32 and the backside blocking dielectric layer 52. The sacrificial fill material portions 47 can be removed selective to the sacrificial liners 13, of the insulator layers 32, and the backside blocking dielectric layer 52 by an etch process, which can be an isotropic etch process such as a wet etch. Subsequently, the sacrificial liners 13 can be removed to physically expose top surfaces of the epitaxial channel portions 11. The top surface of each epitaxial channel portion 11 is physically exposed.

Step 746 includes forming material for at least a portion of the blocking region into memory cavities 49'. In one embodiment, silicon oxide is formed on vertical sidewalls of the memory cavities 49'.

Step 748 is forming material for charge trapping layers for memory cells. In one embodiment, silicon nitride is formed on vertical sidewalls of the silicon oxide that was formed in step 746.

Step 750 is forming material for tunnel dielectrics for memory cells. This might include one or more layers of different materials. FIG. 8V depicts results after one embodiment of step 750. Referring to FIG. 8V, a series of layers including an inner blocking dielectric layer 503, a memory material layer 504, a tunneling dielectric layer 506, and an optional first semiconductor channel layer 601L can be sequentially deposited in each memory openings 49. The inner blocking dielectric layer 503 is also referred to as a second blocking dielectric layer or a front side blocking dielectric layer.

In an illustrative example, the inner blocking dielectric layer 503 can be deposited on the sidewalls of each memory opening 49 by a conformal deposition method. The inner blocking dielectric layer 503 can include a dielectric material that is different from the dielectric material of the backside blocking dielectric layer 52. In one embodiment, the inner blocking dielectric layer 503 can include silicon oxide, a dielectric metal oxide having a different composition than the outer blocking dielectric layer 52, silicon oxynitride, silicon nitride, or a combination thereof. In one embodiment, the inner blocking dielectric layer 503 can include silicon oxide. The inner blocking dielectric layer 503 can be formed by a conformal deposition method such as low pressure chemical vapor deposition, atomic layer deposition, or a combination thereof. The thickness of the inner blocking dielectric layer 503 can be in a range from 1 nm to 20 nm, although lesser and greater thicknesses can also be employed.

In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into at each level of the electrically conductive layers 46 with respect to the insulator layers 32. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. In case the memory material layer 504 is formed as a continuous layer, each portion of the memory material layer 504 located adjacent to an electrically conductive layer 46 constitutes a memory element that is vertically spaced from other memory elements by portions of the memory material layer 504 located adjacent to the insulator layers 32. In this case, a plurality of vertically spaced memory elements can comprise the memory material layer 504, which traps electrical charges at each level of the electrically insulating layers 32. The thickness of the memory material layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 101 nm, although lesser and greater thicknesses can also be employed. A cavity 49' is formed in the volume of each memory opening 49 that is not filled with the deposited material layers (503, 504, 506, 601L).

Figures 8W, 8X:
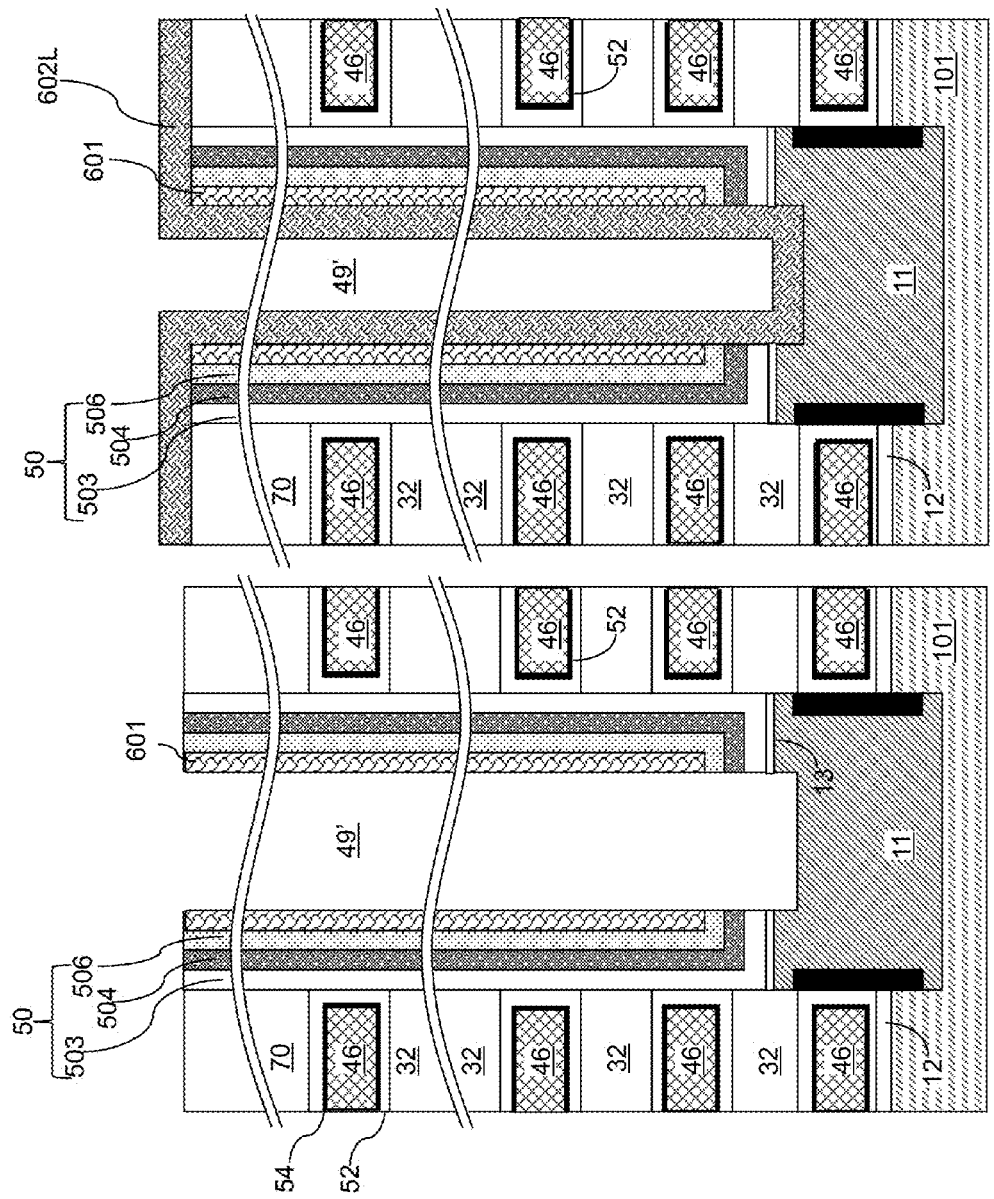

In step 752, etching of layers 601L (if present), 506, 504, 503, and 13 is performed to expose the top surface of epitaxial channel portion 11. Results after one embodiment of step 752 are depicted in FIG. 8W. Referring to FIG. 8W, the optional first semiconductor channel layer 601L, the tunneling dielectric layer 506, the memory material layer 504, the inner blocking dielectric layer 503, and thin oxide liner 13 are sequentially anisotropically etched employing at least one anisotropic etch process. The portions of the first semiconductor channel layer 601L, the tunneling dielectric layer 506, the memory material layer 504, and the inner blocking dielectric layer 503 located above the top surface of the insulating cap layer 70 can be removed by the at least one anisotropic etch process. Further, the horizontal portions of the first semiconductor channel layer 601L, the tunneling dielectric layer 506, the memory material layer 504, the inner blocking dielectric layer 503 and the thin oxide liner 13 at a bottom of each cavity 49' can be removed to form openings in remaining portions thereof. The first semiconductor channel layer 601L can be etched by an anisotropic etch process.

Each of the tunneling dielectric layer 506, the memory material layer 504, the inner blocking dielectric layer 503 and the thin oxide liner 13 can be etched by an isotropic etch process or an anisotropic etch process. Each remaining portion of the first semiconductor channel layer 601L constitutes a first semiconductor channel portion 601. In one embodiment, each memory material layer 504 can include a vertical stack of charge storage regions that store electrical charges upon programming. In one embodiment, the memory material layer 504 can be a charge storage layer in which each portion adjacent to the electrically conductive layers 46 constitutes a charge storage region.

A surface of the epitaxial channel portion 11 (or a surface of the semiconductor substrate layer 101 in case the epitaxial channel portions 11 are not employed) can be physically exposed underneath the opening through the first semiconductor channel portion 601, the tunneling dielectric layer 506, the memory material layer 504, the inner blocking dielectric layer 503 and the thin oxide liner 13. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 101 in case epitaxial channel portions 11 are not employed) by a recess distance. A tunneling dielectric layer 506 is located over the memory material layer 504. A set of an inner blocking dielectric layer 503, a memory material layer 504, and a tunneling dielectric layer 506 in each memory opening 49 constitutes a memory film 50. A plurality of charge storage regions (as embodied as the memory material layer 504) are insulated from surrounding materials by the inner blocking dielectric layer 503 and the tunneling dielectric layer 506.

In one embodiment, the first semiconductor channel portion 601, the tunneling dielectric layer 506, the memory material layer 504, and the inner blocking dielectric layer 503 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Step 754 includes depositing material for the semiconductor channel of the memory cells. Steps 748, 750, 751, and 754 are one embodiment of step 614 from the process of FIG. 6. Results after one embodiment of step 754 are depicted in FIG. 8X. Referring to FIG. 8X, a second semiconductor channel layer 602L can be deposited directly on the semiconductor surface of the epitaxial channel portion 11 (or directly on the semiconductor substrate layer 101 if the epitaxial channel portions 11 are omitted), and directly on the first semiconductor channel portions 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 101 nm, although lesser and greater thicknesses can also be employed. The second semiconductor channel layer 602L may partially fill the cavity 49' in each memory opening, or may fully fill the cavity in each memory opening.

The materials of the first semiconductor channel portions 601 and the second semiconductor channel layer 602L are collectively referred to as a semiconductor channel material. In other words, the semiconductor channel material is a set of all semiconductor material in the first semiconductor channel portions 601 and the second semiconductor channel layer 602L. In one embodiment, the semiconductor channel material serves as a NAND string channel.

Figure 8Y:
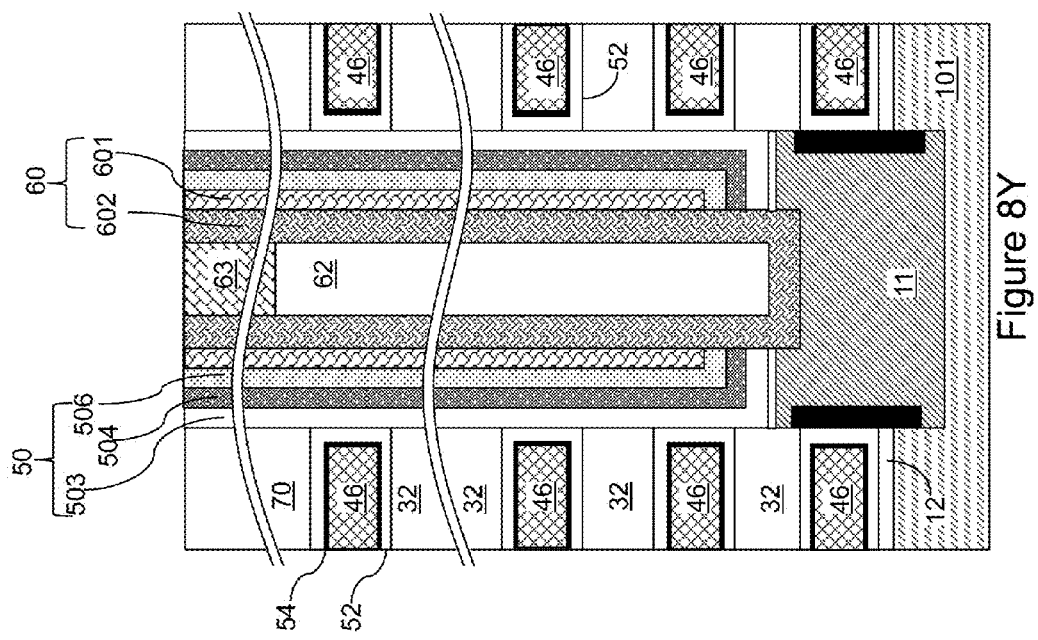
Figure 8Z:
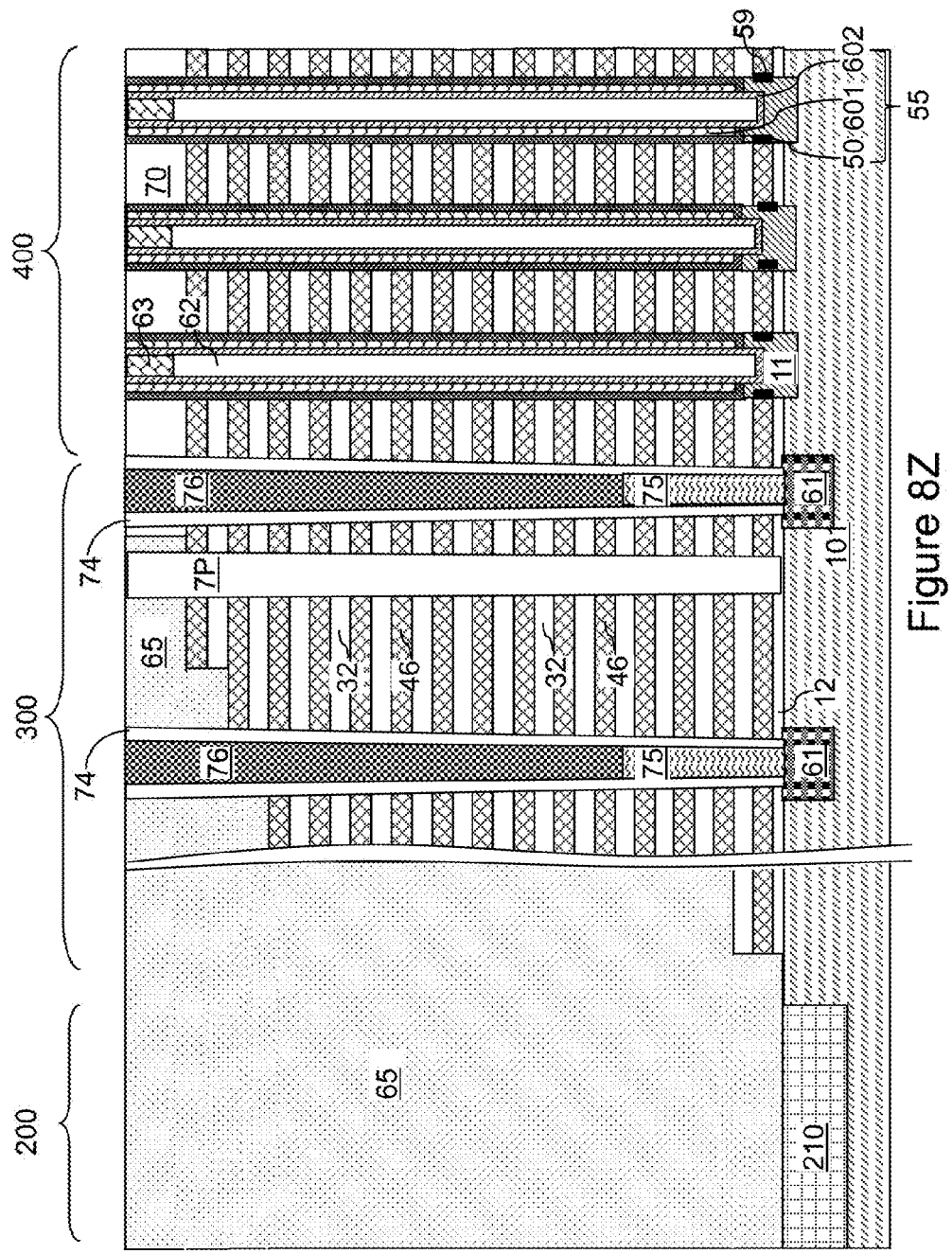

Step 756 is optionally forming a core within the semiconductor channel. Step 758 is forming drain regions of memory cells strings (e.g., vertically oriented NAND strings). Results after one embodiment of step 756 are depicted in FIG. 8Y and in FIG. 8Z. Referring to FIGS. 8Y and 8Z, in case the cavity 49' in each memory opening is not completely filled by the second semiconductor channel layer 602L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the insulating cap layer 70. Each remaining portion of the dielectric core layer constitutes a dielectric core 62. Further, the horizontal portion of the second semiconductor channel layer 602L located above the top surface of the at least one contact level dielectric layer (71, 73) can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. Each set of a memory film 50 and a semiconductor channel 60 with a same memory opening 49 constitutes a memory stack structure (50, 60). A tunneling dielectric layer 506 is embedded within a memory material layer 504, and laterally surrounds a portion of the semiconductor channel 60. As used herein, a macroscopic retention time refers to a retention time suitable for operation of a memory device as a permanent memory device such as a retention time in excess of 24 hours.

The top surface of each dielectric core 62 can be further recessed within each memory opening, for example, by a recess etch to a depth that is located between the top surface of the at least one contact level dielectric layer (71, 73) and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

In one embodiment, the first blocking layer 52 is not formed in the recesses 43' in which the control gates are formed. Rather, a similar blocking layer may be formed in the memory openings. This allows for a thicker layer of material such as titanium nitride between the electrically conductive layers 46 and the insulating layers 32. This helps to reduce or prevent fluorine getting into the insulating layers 32 and causing electrical shorts between electrically conductive layers 46.

Figure 9:
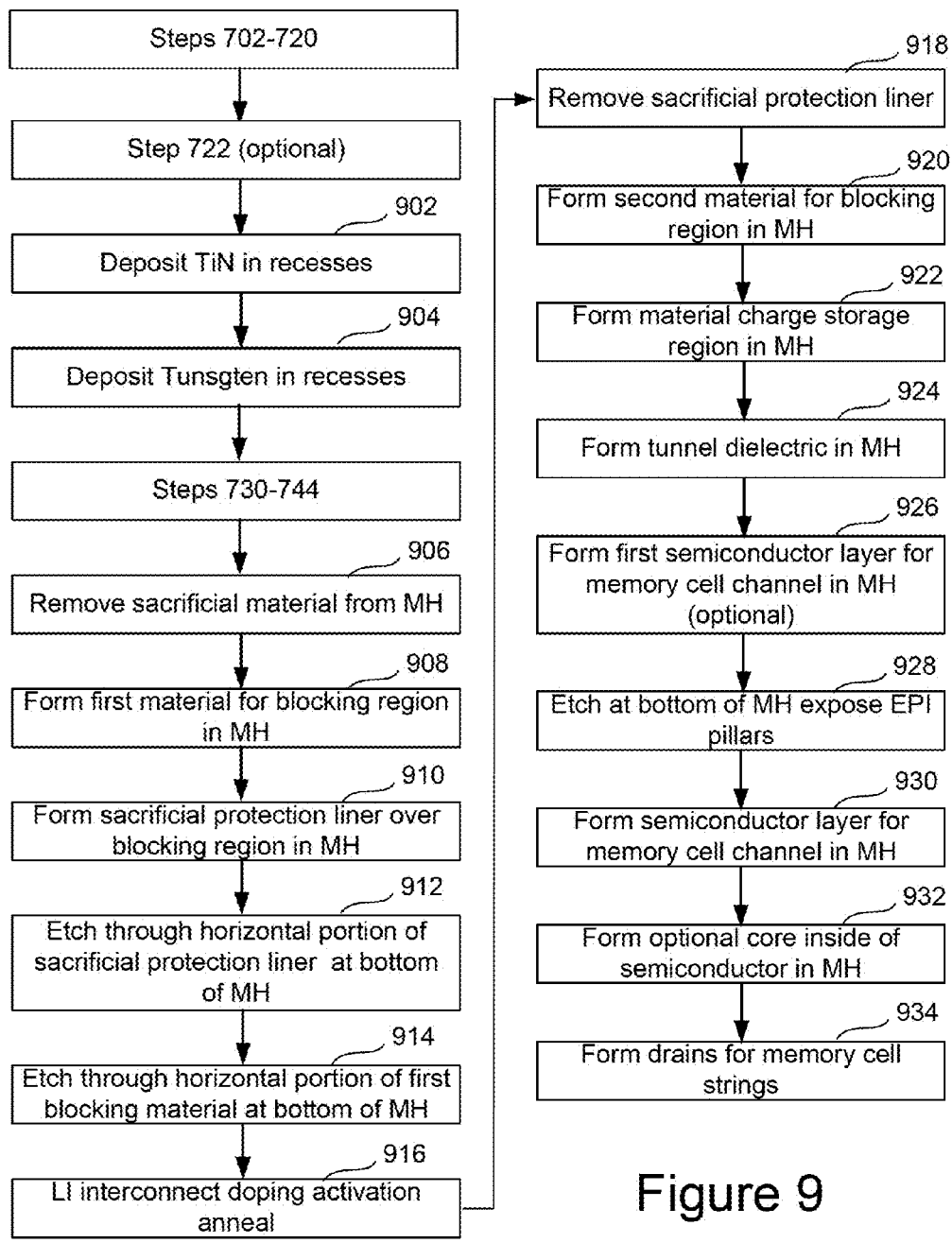
FIG. 9 depicts one embodiment of a process in which blocking layer is not formed in the recesses in which the control gates are formed.
Figure 10A:
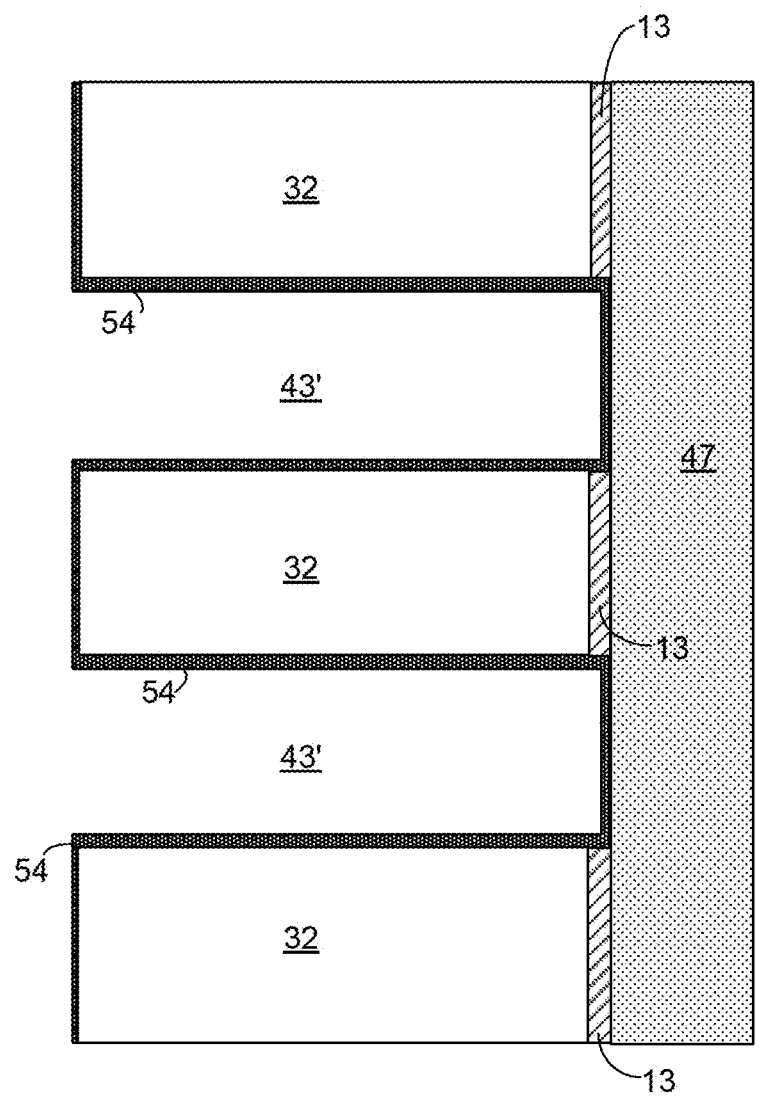
FIGS. 10A-10N depict results after various steps in embodiments of the process of FIG. 9.
Figure 10B:
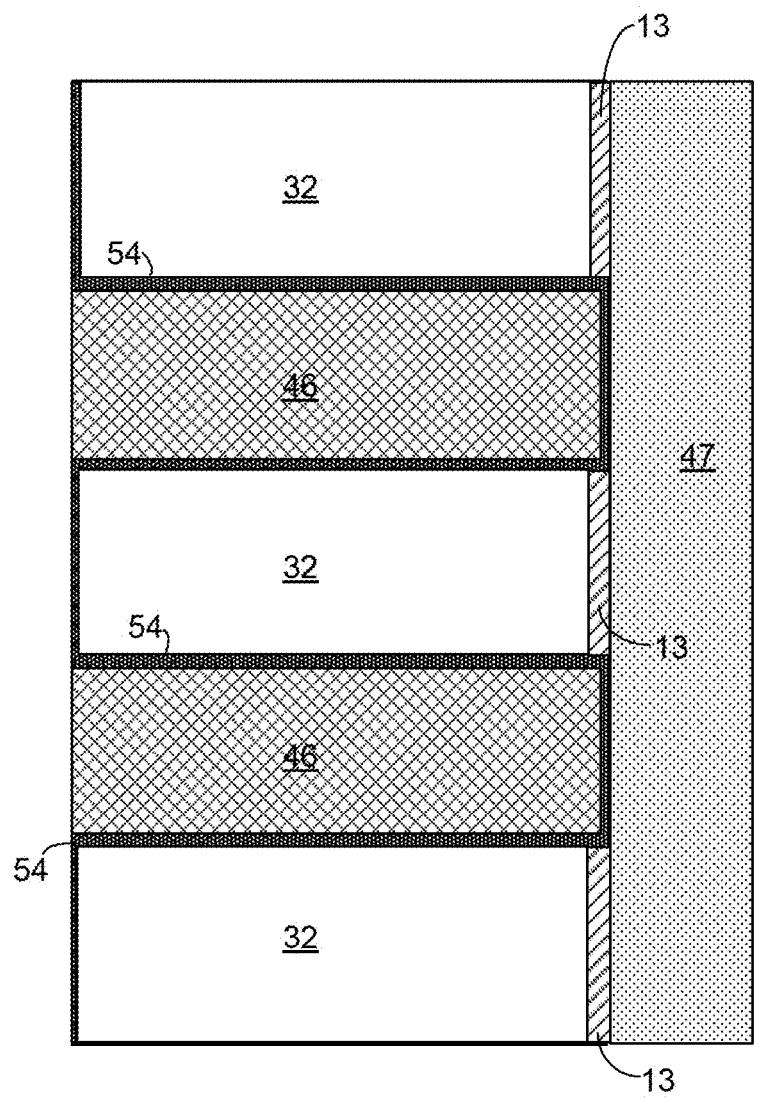

FIG. 9 depicts one embodiment of a process in which first blocking layer 52 is not formed in the recesses 43' in which the control gates are formed. Rather, first blocking layer 52 may be formed in the memory openings. FIGS. 10A-10N depict results after various steps one embodiments of the process of FIG. 9. Initially, processing may be similar to that of the process of FIGS. 7A-7B up to step 720 (and optionally step 722). Thus, if the thin oxide liner was deposited on the vertical sidewalls of the memory holes in step 708, then the portions of the oxide liner may be removed to expose the sacrificial material in the memory holes to the recesses. Results for one embodiment prior to step 902 are as depicted in FIG. 8K. Recall that at this point, sacrificial material layer 42 has been removed, leaving backside recess 43. Also, gate oxide regions 59 have been formed on sidewalls of the epitaxial channel portions 11.

Step 902 includes depositing titanium nitride in the backside recess 43. Results after step 902 for one embodiment are depicted in FIG. 10A. FIG. 10A shows a magnified view of section M from FIG. 8K. FIG. 10A depicts a layer of titanium oxide 54 in recesses 43'. The titanium oxide 54 covers previously exposed portions of sacrificial material 47, as well as exposed portions of insulator 32.

Step 904 includes depositing tungsten in the recesses. Results after step 904 for one embodiment are depicted in FIG. 10B. FIG. 10B shows a magnified view of section M from FIG. 8K. FIG. 10M depicts a titanium in the former recesses 43'.

Next, the process may be similar to steps 730-744 of the process of FIGS. 7A-7B. Recall that these steps included performing a word line recess (to separate word lines) and forming local interconnects.

In step 906, the sacrificial material is removed from the memory openings. Results after step 906 for one embodiment are depicted in FIG. 10C. FIG. 10C shows a memory opening 49' within alternating stack (32, 42) over substrate 101. At the bottom of memory opening 49' is an epitaxial channel portion 11.

In step 908, the first material for the blocking region is formed in the memory holes. Results after step 908 for one embodiment are depicted in FIG. 10D. Referring to FIG. 10D, an outer blocking dielectric layer 501 can be deposited on the thin oxide layer 13 over the epitaxial channel portions 11 and vertical sidewalls of the memory openings 49. The outer blocking dielectric layer 501 is also referred to as a first blocking dielectric layer. The outer blocking dielectric layer 501 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the outer blocking dielectric layer 501 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The outer blocking dielectric layer 501 can be deposited, for example, by chemical vapor deposition (CVD), atomic layer deposition (ALD), pulsed laser deposition (PLD), liquid source misted chemical deposition, or a combination thereof. The thickness of the outer blocking dielectric layer 501 can be in a range from 1 nm to 20 nm, although lesser and greater thicknesses can also be employed. The outer blocking dielectric layer 501 can subsequently function as a dielectric material portion that blocks leakage of stored electrical charges to control gate electrodes. In one embodiment, the outer blocking dielectric layer 501 includes aluminum oxide that is deposited in an amorphous phase.

In step 910, a sacrificial protection liner is formed over the outer blocking dielectric layer 501. Results after one embodiment of step 910 are depicted in FIG. 10E. Referring to FIG. 10E, a sacrificial protection liner 502 can be deposited over the outer blocking dielectric layer 501. The sacrificial protection liner 502 includes a material that can be removed selective to the material of the outer blocking dielectric layer 501 in a subsequent etch process. For example, the sacrificial protection liner 502 can include amorphous silicon, polysilicon, or amorphous carbon. The sacrificial protection liner 502 can be deposited by a conformal deposition process such as chemical vapor deposition.

Step 912 includes etching through horizontal portions of the sacrificial protection liner at the bottom of the memory openings. Results after one embodiment of step 912 are depicted in FIG. 10F. Referring to FIG. 10F, an anisotropic etch is performed to remove horizontal portions of the sacrificial protection liner 502. Each vertical portion of the sacrificial protection liner 502 within a memory opening constitutes a sacrificial spacer that contacts an inner sidewall of a vertical portion of the outer blocking dielectric layer 501.

Step 914 includes etching through the physically exposed portions of the outer blocking dielectric layer 501 at the bottoms of the memory openings. Step 914 may also include etching through the thin oxide liner 13 at the bottoms of the memory openings. Results after one embodiment of step 914 are depicted in FIG. 10G.

Figure 10G:
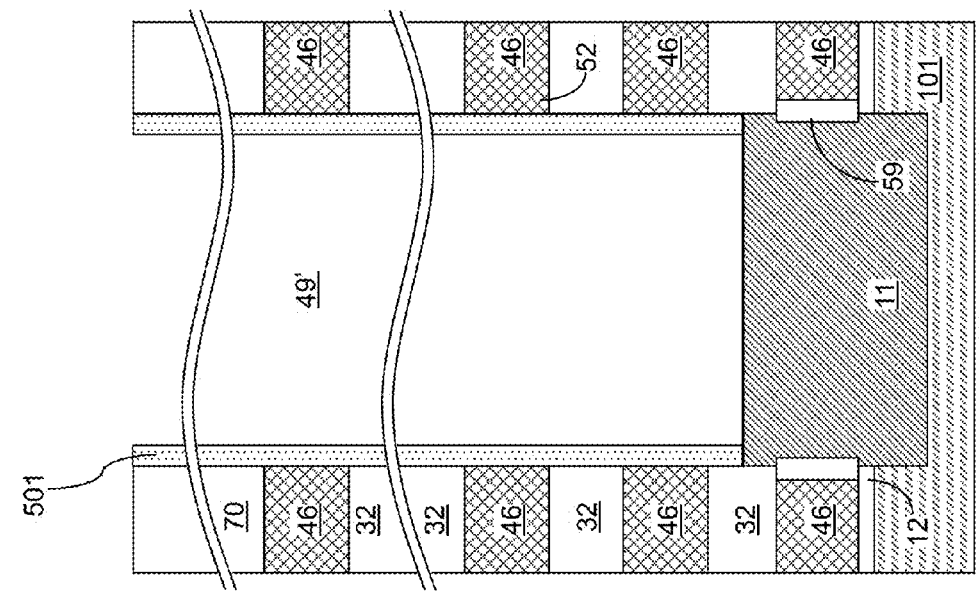

Referring to FIG. 10G, an etch process is performed to remove physically exposed portions of the outer blocking dielectric layer 501. An isotropic etch process or an anisotropic etch process can be employed. For example, a wet etch employing a combination of ammonia and hydrogen peroxide can be employed to remove the outer blocking dielectric layer 501. The sacrificial protection liner 502 protects the vertical portions of the outer blocking dielectric layer 501 within each memory opening during the etch process that removes the horizontal portions of the outer blocking dielectric layer 501. Each remaining portion of the outer blocking dielectric layer 501 within a memory opening constitutes an annular spacer contacting the sidewall of the memory opening, i.e., contacting sidewalls of the insulator layers 32 and the electrically conductive layers 46.

Step 916 includes performing a doping activating anneal for the local interconnects. In one embodiment, the anneal is performed at 1000 C. This step may also crystallize the first blocking material 501.

Figure 10H:
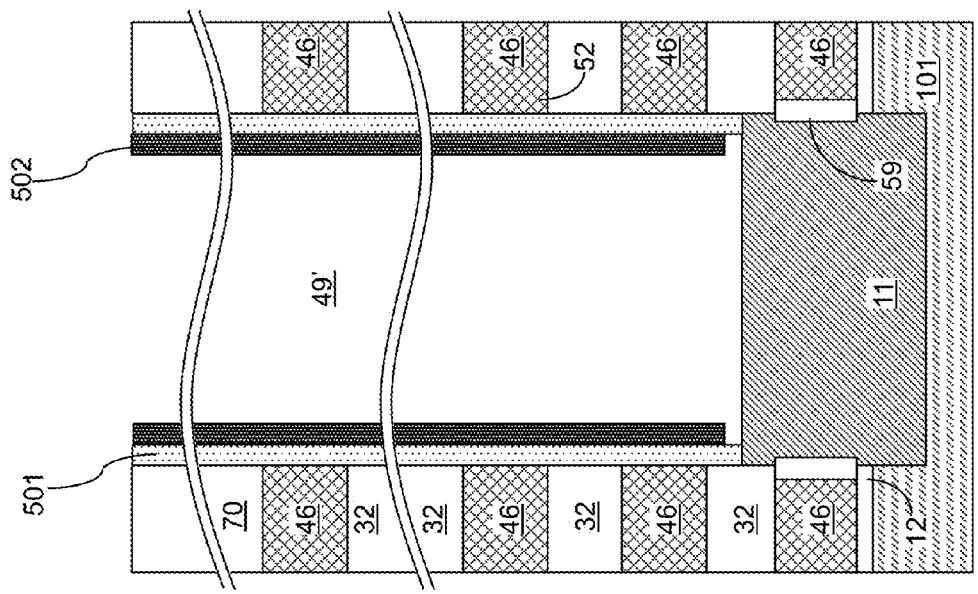
Figure 10M:
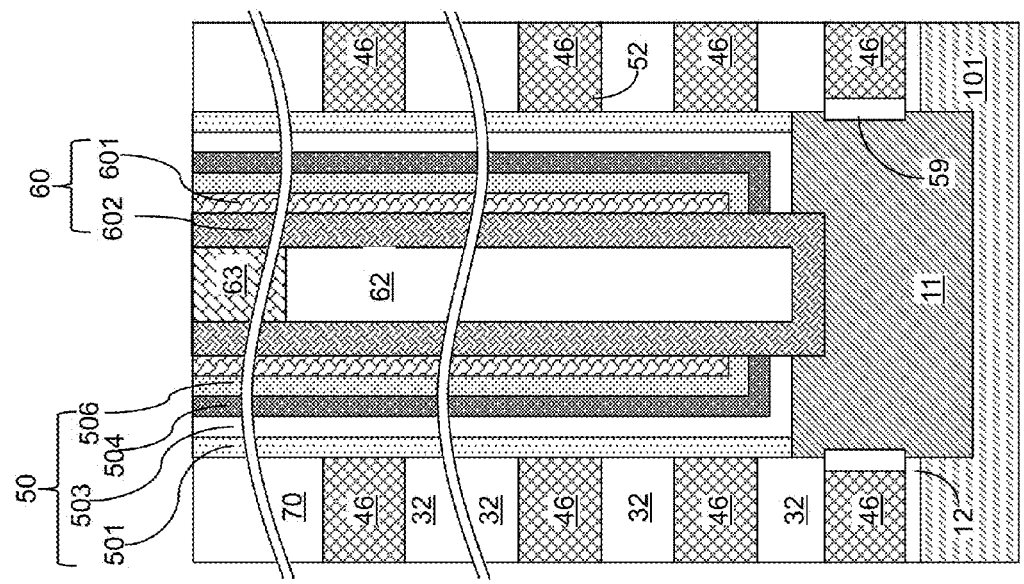
Figure 10N:
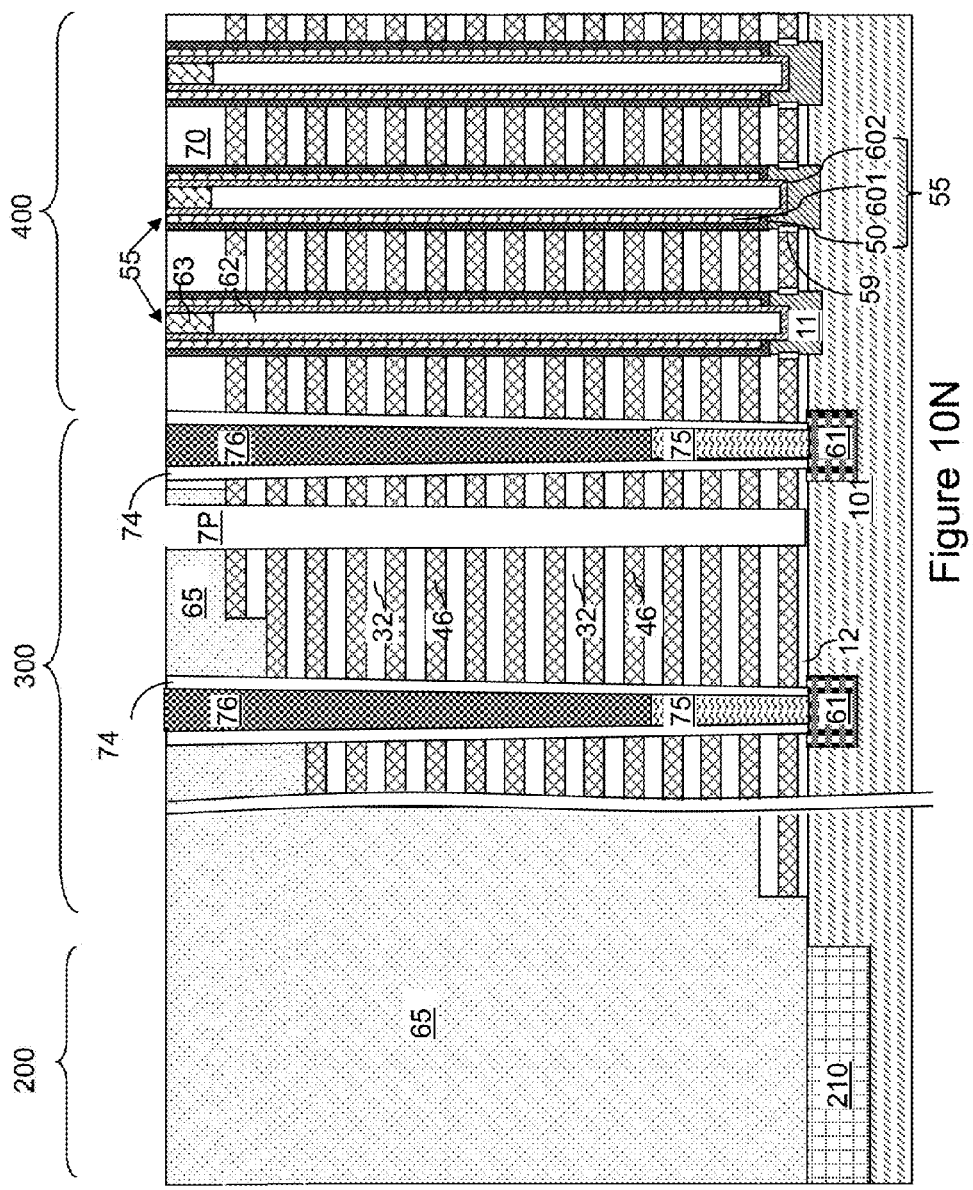

Step 918 includes removing the sacrificial protection liner. Results after one embodiment of step 918 are depicted in FIG. 10H. Referring to FIG. 10H, the sacrificial protection layer 502 is removed from each memory opening by an etch process that is selective to the materials of the outer blocking dielectric layer 501. For example, if the outer blocking dielectric layer 501 comprises aluminum oxide and the sacrificial protection layer 502 includes polysilicon, a wet etch employing KOH can be employed.

Step 920 includes forming an inner blocking dielectric layer 503 in the memory openings. Results after one embodiment of step 920 are depicted in FIG. 10I. Referring to FIG. 10I, an inner blocking dielectric layer 503 can be deposited on the epitaxial channel portions 11 and the outer blocking dielectric layers 501. The inner blocking dielectric layer 503 is also referred to as a second blocking dielectric layer. The inner blocking dielectric layer 503 can include a dielectric material that is different from the dielectric material of the outer blocking dielectric layer 501. In one embodiment, the inner blocking dielectric layer 503 can include silicon oxide, a dielectric metal oxide having a different composition than the outer blocking dielectric layer 501, silicon oxynitride, silicon nitride, or a combination thereof. In one embodiment, the inner blocking dielectric layer 503 can include silicon oxide. The inner blocking dielectric layer 503 can be formed by a conformal deposition method such as low pressure chemical vapor deposition, atomic layer deposition, or a combination thereof. The thickness of the inner blocking dielectric layer 503 can be in a range from 1 nm to 20 nm, although lesser and greater thicknesses can also be employed.

Step 922 includes forming material for charge trapping layers of memory cells. In one embodiment, silicon nitride is formed on vertical sidewalls of the silicon oxide that was formed in step 920. Step 924 includes forming material for tunnel dielectrics for memory cells. This might include one or more layers of different materials. Optional step 926 is forming first semiconductor channel layer. Results after one embodiment of step 926 are depicted in FIG. 10J Referring to FIG. 10J, a series of layers including a memory material layer 504, a tunneling dielectric layer 506, and an optional first semiconductor channel layer 601L can be sequentially deposited in each memory openings 49. The memory material layer 504, the tunneling dielectric layer 506, and the optional first semiconductor channel layer 601L can be deposited employing the same processing steps as the processing steps of FIG. 7.

Step 928 includes etching at the bottoms of memory openings to expose tops of EPI pillars. Results after one embodiment of step 928 are depicted in FIG. 10K. Referring to FIG. 10K, the processing steps of FIGS. 7A-7B can be performed to remove horizontal portions of the first semiconductor channel layer 601L, the tunneling dielectric layer 506, the memory material layer 504, and the inner blocking dielectric layer 503.

Step 930 includes forming the semiconductor channel. Results after one embodiment of step 928 are depicted in FIG. 10L. Referring to FIG. 10L, the processing steps of FIGS. 7A-7B can be performed to deposit a second semiconductor channel layer 602L.

Step 932 is forming an optional core in the semiconductor channel. Step 934 includes forming drains for memory cell strings. Results after one embodiment of step 932 are depicted in FIG. 10M. Referring to FIG. 10M, the processing steps of FIGS. 7A-7B can be performed to form a memory stack structure (50, 60) within each memory opening.

FIG. 10N illustrates the second exemplary structure after formation of memory stack structures 55.

One embodiment disclosed herein includes a method of fabricating non-volatile storage, which comprises the following. Alternating layers of a first material and a second material are formed above a substrate having a major surface. Holes are etched in the alternating layers of the first material and the second material. The holes have sidewalls that extend vertically with respect to the major surface. A sacrificial material is formed in the holes. The layers of the first material are removed while leaving in place the layers of the second material and the sacrificial material in the holes, leaving recesses where the first material was removed. A conductive material is formed in the recesses. The sacrificial material is removed from the holes after forming the conductive material in the recesses. Charge storage regions and channels of memory cells are formed in the holes after removing the sacrificial material. The conductive material forms control gates of the memory cells.

One embodiment disclosed herein includes method of fabricating non-volatile storage, which comprises the following. Alternating layers of an insulator and a sacrificial material are formed above a substrate having a major surface. The insulator has a major surface that extends parallel to the major surface of the substrate. The sacrificial material has a major surface that extends parallel to the major surface of the substrate. Openings are etched in the alternating layers of the insulator and the sacrificial material. The openings have sidewalls that are defined by the layers of the insulator and the sacrificial material. An etch stop layer is deposited on the sidewalls of the openings. Sacrificial nitride is deposited on the etch stop layer in the openings. The sacrificial nitride extends vertically with respect to the major surfaces of the insulator and the sacrificial material. The layers of the sacrificial material are removed while leaving in place the layers of the insulator and the sacrificial nitride in the openings, leaving recesses where the layers of sacrificial material were removed. A conductive material is formed in the recesses. The sacrificial nitride is removed from the openings after forming the conductive material in the recesses. A memory film is formed in the openings after removing the sacrificial nitride from the openings.

One embodiment includes a method of fabricating non-volatile storage, which comprises the following. Alternating layers of silicon oxide and silicon nitride are formed above a substrate having a major surface. Memory holes are etched in the alternating layers of the silicon oxide and the silicon nitride. The memory holes have vertical sidewalls that are defined by the layers of silicon oxide and silicon nitride. An etch stop layer is deposited on the vertical sidewalls of the memory holes. Silicon nitride is formed on the etch stop layer in the memory holes. The silicon nitride has an air gap. The layers of the silicon nitride are etched away while leaving in place the layers of the silicon oxide and the silicon nitride in the memory holes, leaving recesses where the layers of silicon nitride were removed. Tungsten is deposited in the recesses. The silicon nitride is removed from the memory holes after depositing the tungsten in the recesses. Vertically oriented NAND strings of non-volatile storage elements are formed in the memory holes after removing the silicon nitride from the memory holes. The tungsten serves as control gates for the non-volatile storage elements.

One of skill in the art will recognize that this technology is not limited to the two dimensional and three dimensional exemplary structures described but covers all relevant memory structures within the spirit and scope of the technology as described herein and as understood by one of skill in the art. The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of fabricating non-volatile storage, the method comprising:
    forming alternating layers of a first material and a second material above a substrate having a major surface;
    etching holes in the alternating layers of the first material and the second material, wherein the holes have sidewalls that extend vertically with respect to the major surface;
    forming a region of silicon at bottoms of the holes;
    forming a protective layer of a material other than silicon on the region of silicon at the bottoms of the holes;
    forming a sacrificial material in the holes after forming the protective layer;
    removing the layers of the first material while leaving in place the layers of the second material and the sacrificial material in the holes, leaving recesses where the first material was removed;
    forming a conductive material in the recesses;
    removing the sacrificial material from the holes after forming the conductive material in the recesses;
    removing the protective layer from the region of silicon after removing the sacrificial material from the holes; and
    forming charge storage regions and channels of memory cells in the holes after removing the sacrificial material and the protective layer, wherein the conductive material forms control gates of the memory cells.

2. The method of claim 1, further comprising:
    etching openings in the alternating layers of the first material and the second material, wherein removing the layers of the first material comprises:
    introducing an etchant into the openings.

3. The method of claim 1, further comprising:
    depositing an etch stop layer on the sidewalls of the holes prior to forming the sacrificial material in the holes, wherein the etch stop layer has etch selectivity with respect to the first material.

4. The method of claim 1, further comprising:
forming a blocking layer of dielectric material in the recesses prior to forming the conductive material in the recesses.

5. The method of claim 1, further comprising:
forming a blocking layer of dielectric material between the charge storage regions and the conductive material.

6. The method of claim 1, wherein forming the charge storage regions comprises forming a charge storage layer that extends vertically in the holes, further comprising forming a tunnel dielectric layer on the charge storage layer, wherein forming the channels of memory cells comprises forming a semiconductor channel material on the tunnel dielectric layer.

7. The method of claim 1, wherein forming the sacrificial material in the holes comprises:
forming an air gap within the sacrificial material.

8. The method of claim 1, wherein the protective layer of the material other than silicon is a first protective material, and further comprising:
forming a second protective material other than the first protective material on sidewalls of the holes after removing the sacrificial material from the holes and prior to removing the first protective material from the region of silicon at the bottoms of the holes.

9. The method of claim 1, wherein the first material has an etch selectivity with respect to the second material, wherein the second material is an insulator.

10. The method of claim 1, wherein the first material is silicon oxide and the second material is silicon nitride.

11. The method of claim 1, wherein the sacrificial material comprises either amorphous silicon or polysilicon.

\* \* \* \* \*